US012598963B2

(12) United States Patent
Ahn

(10) Patent No.: US 12,598,963 B2
(45) Date of Patent: Apr. 7, 2026

(54) METHODS OF MANUFACTURING SEMICONDUCTOR DEVICES USING ENHANCED PATTERNING TECHNIQUES

(71) Applicant: Samsung Electronics Co., Ltd., Suwon-si (KR)

(72) Inventor: Junhyeok Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 841 days.

(21) Appl. No.: 17/931,150

(22) Filed: Sep. 12, 2022

(65) Prior Publication Data

US 2023/0197450 A1 Jun. 22, 2023

(51) Int. Cl.
 H01L 21/033 (2006.01)
 H01L 21/308 (2006.01)
 (Continued)

(52) U.S. Cl.
 CPC ...... H01L 21/0337 (2013.01); H01L 21/0332 (2013.01); H01L 21/3081 (2013.01);
 (Continued)

(58) Field of Classification Search
 CPC ............. H01L 21/0337; H01L 21/0332; H01L 21/3081; H01L 21/3086; H01L 21/76229;
 (Continued)

(56) References Cited

U.S. PATENT DOCUMENTS

| | | |
|---|---|---|
| 6,455,394 B1 | 9/2002 | Iyer et al. |
| 2005/0142795 A1 | 6/2005 | Ahn et al. |

(Continued)

FOREIGN PATENT DOCUMENTS

| | | |
|---|---|---|
| KR | 20050067445 A | 7/2005 |
| KR | 20080109151 A | 12/2008 |

(Continued)

OTHER PUBLICATIONS

"Office Action", Taiwan Application No. 111147884, Sep. 13, 2023, 6 pp.

*Primary Examiner* — Caleen O Sullivan
(74) *Attorney, Agent, or Firm* — Wolf, Greenfield & Sacks, P.C.

(57) ABSTRACT

A semiconductor device fabrication method includes forming a substrate having first and second regions therein, with different densities of active regions in the first and second regions. A cell trench is formed, which defines cell active regions in the first region, and a peripheral trench is formed, which defines peripheral active regions in the second region. A first insulating layer is formed in the cell trench and the peripheral trench. A mask is selectively formed, which covers the first insulating layer in the first region and exposes the first insulating layer in the second region. A second insulating layer is formed on the first insulating layer in the second region exposed by the mask, using a selective dielectric-on-dielectric deposition process. The first insulating layer is exposed in the first region by removing the mask. A third insulating layer is formed on the first insulating layer in the first region and on the second insulating layer in the second region.

20 Claims, 31 Drawing Sheets

(51) Int. Cl.
    *H01L 21/762*     (2006.01)
    *H10B 12/00*     (2023.01)

(52) U.S. Cl.
    CPC .... *H01L 21/3086* (2013.01); *H01L 21/76229* (2013.01); *H10B 12/053* (2023.02); *H10B 12/50* (2023.02)

(58) Field of Classification Search
    CPC ... H01L 21/3085; H10B 12/053; H10B 12/50; H10B 12/09; H10B 12/482; H10D 62/113
    USPC ........................................................ 438/427
    See application file for complete search history.

(56)             References Cited

U.S. PATENT DOCUMENTS

| | | | |
|---|---|---|---|
| 2005/0266655 A1 | 12/2005 | Nemani et al. | |
| 2008/0283960 A1 | 11/2008 | Lerner | |
| 2009/0203189 A1 | 8/2009 | Shin et al. | |
| 2014/0231919 A1 | 8/2014 | Peng et al. | |
| 2017/0062266 A1 | 3/2017 | Deng et al. | |
| 2017/0140997 A1* | 5/2017 | Pae ...................... | H10D 30/024 |
| 2019/0103276 A1 | 4/2019 | Peng et al. | |
| 2019/0214293 A1 | 7/2019 | Kim et al. | |
| 2020/0058744 A1 | 2/2020 | Wang et al. | |
| 2020/0075730 A1 | 3/2020 | Lee et al. | |

FOREIGN PATENT DOCUMENTS

| | | |
|---|---|---|
| KR | 20090087642 A | 8/2009 |
| KR | 20130022950 A | 3/2013 |
| KR | 10-2019-0084731 A | 7/2019 |

* cited by examiner

METHODS OF MANUFACTURING SEMICONDUCTOR DEVICES USING ENHANCED PATTERNING TECHNIQUES

REFERENCE TO PRIORITY APPLICATION

This application claims priority to Korean Patent Application No. 10-2021-0183437, filed Dec. 21, 2021, the disclosure of which is hereby incorporated herein by reference.

BACKGROUND

Example embodiments of the present disclosure relate to methods of manufacturing semiconductor devices.

In accordance with development of the electronics industry and demand from users, electronic devices have been designed to have a reduced size and high-performance. Accordingly, semiconductor devices used in electronic devices have also been required to be highly integrated and to have high-performance. To manufacture a highly scaled semiconductor device, a function of a device isolation layer for electrical isolation between individual unit devices has become important. To implement fine patterns, a process of manufacturing a semiconductor device has become more complicated and manufacturing costs have also increased.

SUMMARY

An example embodiment of the present disclosure is to provide a semiconductor device having improved electrical properties and manufactured through a simplified manufacturing process, and a method of manufacturing the same.

According to an example embodiment of the present disclosure, a method of manufacturing a semiconductor device includes forming a stack of a first mask layer, a second mask layer, and a third mask layer, on an etch target layer, which is disposed on a substrate. Third mask patterns are formed by etching the third mask layer, and then a first spacer layer is formed on the third mask patterns. A mask is then formed, which covers the first spacer layer (on a first region of the substrate) and exposes the first spacer layer (on a second region of the substrate). A second spacer layer is formed, which covers the first spacer layer on the second region exposed by the mask, using a selective dielectric-on-dielectric deposition process. The first spacer layer on the first region is then exposed by removing the mask. First spacer patterns are then formed by etching the first spacer layer on the first region, and second spacer patterns are formed by etching the first spacer layer and the second spacer layer on the second region. Second mask patterns are formed by etching the second mask layer using the first spacer patterns and the second spacer patterns as an etching mask. Thereafter, first mask patterns are formed by etching the first mask layer using the second mask patterns as an etching mask. The etch target layer may then be etched using the first mask patterns as an etching mask.

According to another embodiment of the present disclosure, a method of manufacturing a semiconductor device includes forming a substrate having first and second regions therein with different arrangement densities of active regions in the first and second regions. A cell trench is then formed to define cell active regions in the first region, and a peripheral trench is formed to define peripheral active regions in the second region. A first insulating layer is then formed in the cell trench and in the peripheral trench. A mask is then formed, which covers the first insulating layer in the first region and exposes the first insulating layer in the second region. A second insulating layer is formed on the first insulating layer in the second region, which is exposed by the mask, using a selective dielectric-on-dielectric deposition process. The first insulating layer in the first region is then exposed by removing the mask. A third insulating layer is then formed on the first insulating layer in the first region and on the second insulating layer in the second region.

According to a further embodiment of the present disclosure, a method of manufacturing a semiconductor device includes forming a substrate having first and second regions therein and different densities of active regions in the first and second regions. A cell trench is then formed, which defines cell active regions in the first region and includes a first cell trench portion having a relatively narrow width and a second cell trench portion having a relatively wide width (in the first region). A peripheral trench is also formed, which defines peripheral active regions in the second region and includes a first peripheral trench portion having a relatively narrow width and a second peripheral trench portion having a relatively wide width (in the second region). A first insulating layer is then formed that contacts a sidewall of the cell active regions in the cell trench and contacts a sidewall of the peripheral active regions in the peripheral trench. A mask is then formed on the first insulating layer in the first region, before a second insulating layer is formed on the first insulating layer in the second region using a selective dielectric-on-dielectric deposition process. The first insulating layer in the first region is then exposed by removing the mask. A third insulating layer is then formed on the first insulating layer in the first region and on the second insulating layer in the second region. A fourth insulating layer is then formed on the third insulating layer. A planarization process is then performed until an upper surface of the substrate is exposed. A gate trench is formed, which crosses the cell active regions in the substrate in the first region. A gate is then formed in the gate trench, and a peripheral gate is formed on the peripheral active regions of the second region.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
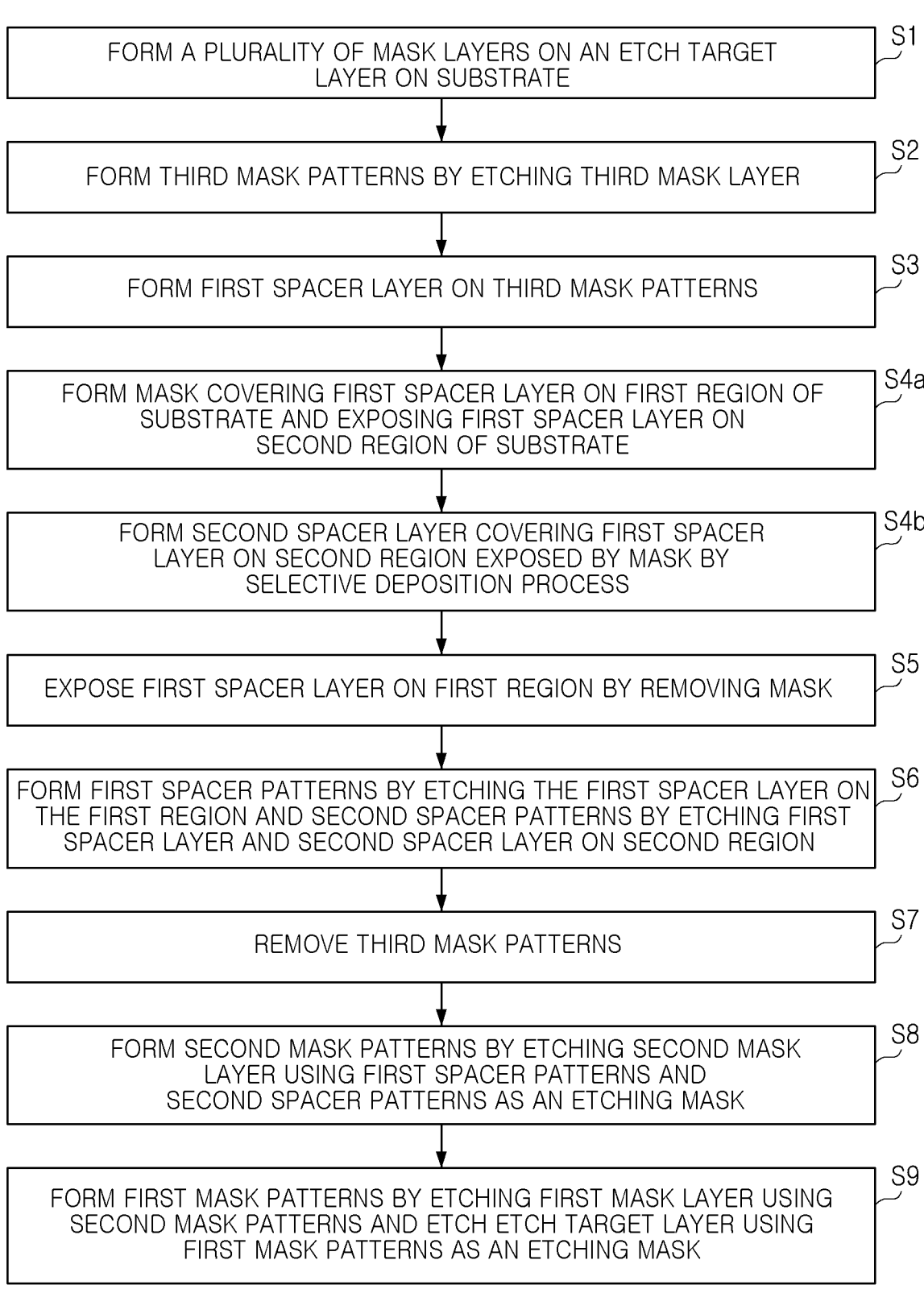
FIG. 1 is a flowchart illustrating processes of a method of manufacturing a semiconductor device in sequence according to an example embodiment of the present disclosure.

FIG. 1 is a flowchart illustrating sequential processes within a method of manufacturing a semiconductor device according to example embodiments, and FIGS. 2A to 11B are cross-sectional illustrations of intermediate structures that illustrate methods of manufacturing a semiconductor device according to example embodiments.

Figure 2A:
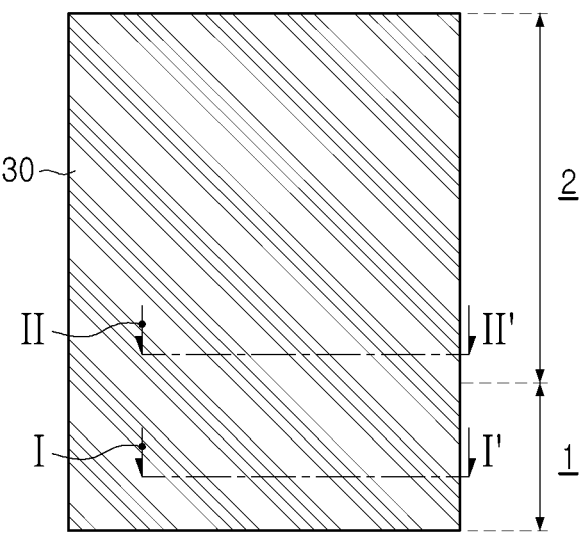
FIGS. 2A to 11B are diagrams illustrating a method of manufacturing a semiconductor device according to an example embodiment of the present disclosure.
Figure 2B:
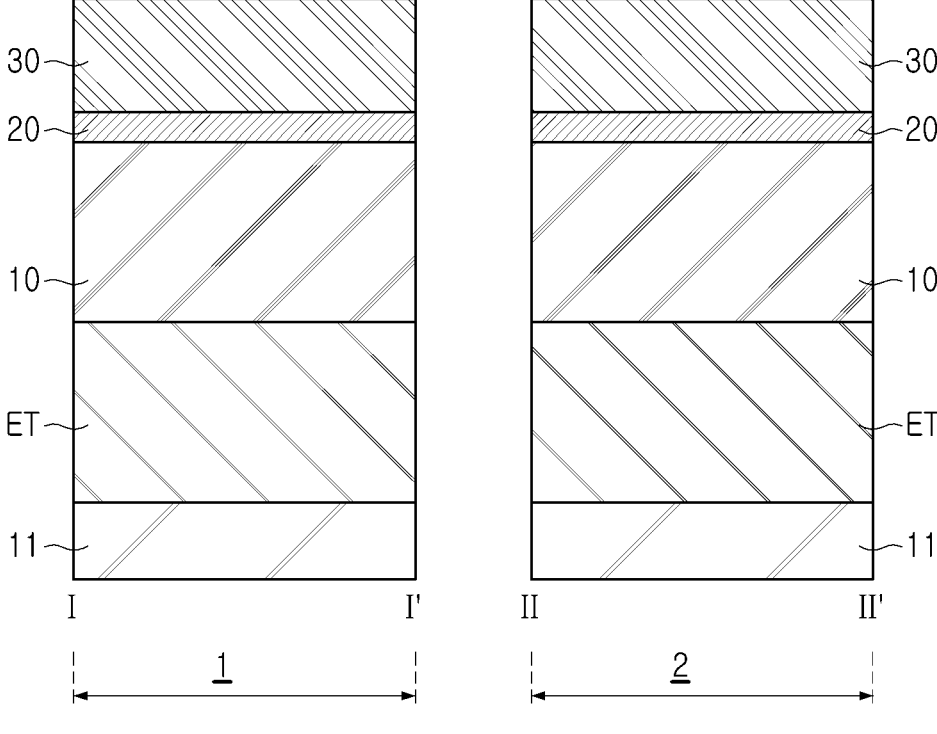

Referring to FIGS. 1, 2A, and 2B, a plurality of mask layers 10, 20, and 30 may be formed on an etch target layer ET, which extends on a substrate 11 (S1). The plurality of mask layers 10, 20, and 30 may include a first mask layer 10, a second mask layer 20 on the first mask layer 10, and a third mask layer 30 on the second mask layer 20 so that the second mask layer 20 extends between the first and third mask layers 10, 30. The plurality of mask layers 10, 20, and 30 may be used collectively as a mask for forming a pattern on the etch target layer ET, or may be configured as layers for forming the mask. For example, the first mask layer 10 may be used as a hard mask for forming a pattern on the etch target layer ET, and the second and third mask layers 20 and 30 may be utilized to pattern the hard mask.

The substrate 11 may be configured as a semiconductor substrate such as a silicon wafer. The etch target layer ET may be configured as an electrically conductive layer or as an electrically insulating layer formed on the substrate 11. And, in example embodiments, the etch target layer ET may correspond to a portion of the substrate 11. For example, the etch target layer ET may correspond to components of a device patterned in a line type. The etch target layer ET may be configured as, for example, a portion of the bit line structure ("420" in FIG. 26A), a portion in the substrate 11 for forming a gate of a buried channel array transistor (BCAT), a conductive layer for forming a landing pad ("470" in FIG. 26A), or an insulating layer for forming an insulating pattern ("425" in FIGS. 26B, 26C) between bit line structures.

The plurality of mask layers 10, 20, and 30 may have various film materials depending on a material of the etch target layer ET. In particular, the plurality of mask layers 10, 20, and 30 may be formed of materials having etch selectivity with respect to the etch target layer ET disposed therebelow and/or different mask layers. For example, each of the plurality of mask layers 10, 20, and 30 may be formed of at least one of a silicon-containing material such as silicon oxide, silicon oxynitride, silicon nitride, or polysilicon, an amorphous carbon layer (ACL), or a carbon-containing material consisting of a hydrocarbon compound or a derivative thereof, such as spin-on hardmask (SOH), bottom anti-reflective coating (BARC), a metal or an organic material.

Figure 3A:
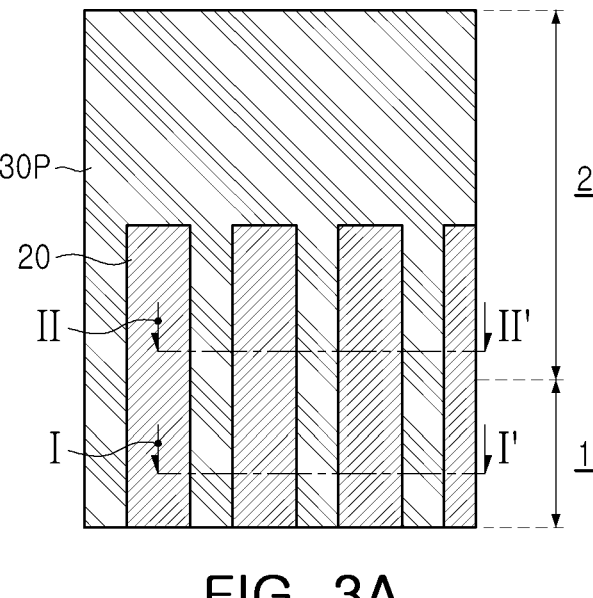
Figure 3B:
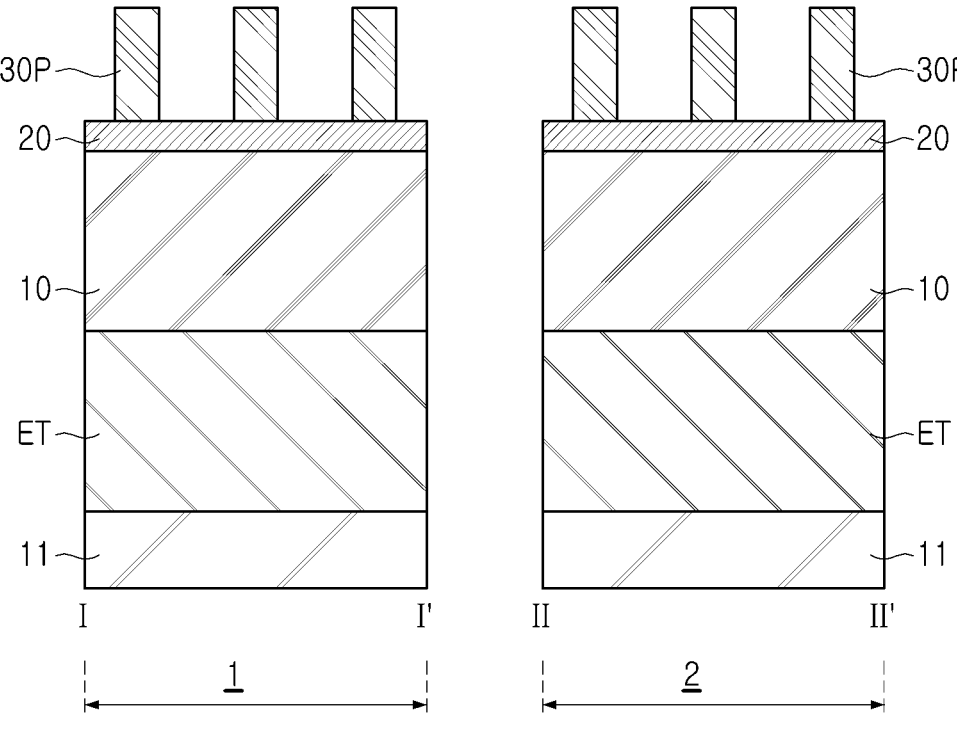

Referring now to FIGS. 2, 3A, and 3B, in some embodiments, third mask patterns 30P may be formed by etching the third mask layer 30 (S2). First, a photoresist layer (not illustrated) may be formed on the third mask layer 30 and the photoresist layer may be patterned by performing a photolithography process. Thereafter, an etching process may be performed on the third mask layer 30 using the patterned photoresist layer. The third mask layer 30 may be patterned to correspond to the patterned photoresist layer, and the third mask patterns 30P may be, for example, line-type patterns extending in the first direction.

Figure 4A:
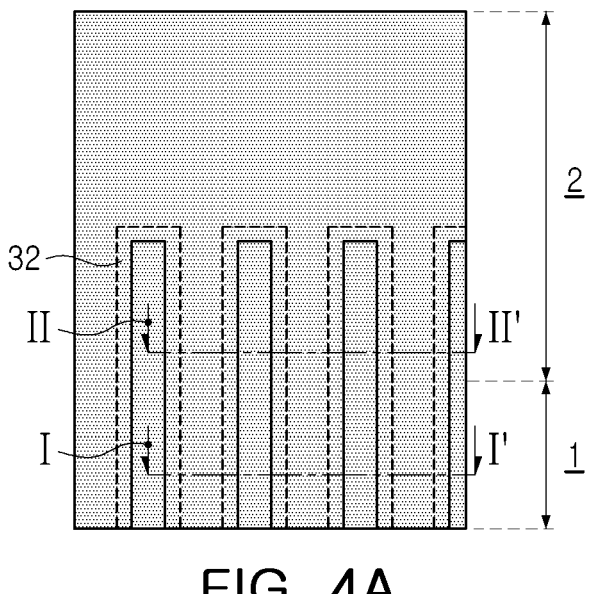
Figure 4B:
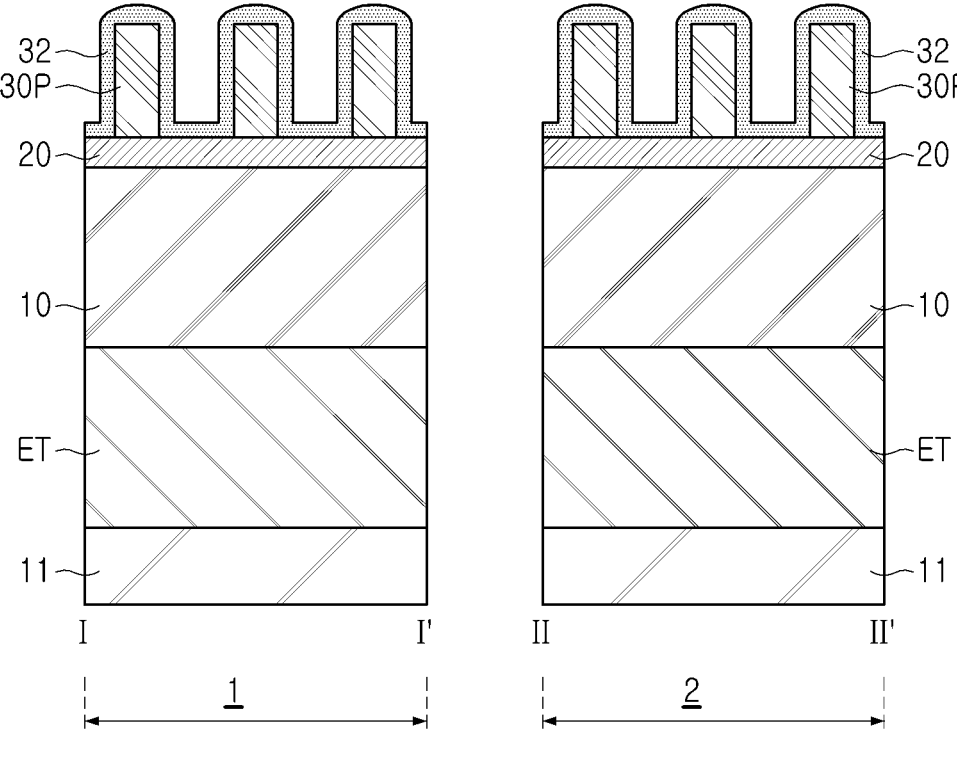

Referring now to FIGS. 2, 4A, and 4B, a first spacer layer 32 may be formed (e.g., conformally deposited) on the third mask patterns 30P (S3). In some embodiments, the first spacer layer 32 may be formed as a blanket layer on the entire region of the substrate 11, and may extend to cover an upper surface and side surfaces of the third mask patterns 30P, and may be formed to cover exposed portions of the upper surface of the second mask layer 20. The first spacer layer 32 may be formed of, for example, a material having etch selectivity with respect to the plurality of mask layers 10, 20, and 30. For example, the first spacer layer 32 may include at least one of silicon oxide, silicon nitride, and silicon oxynitride.

Figure 5A:
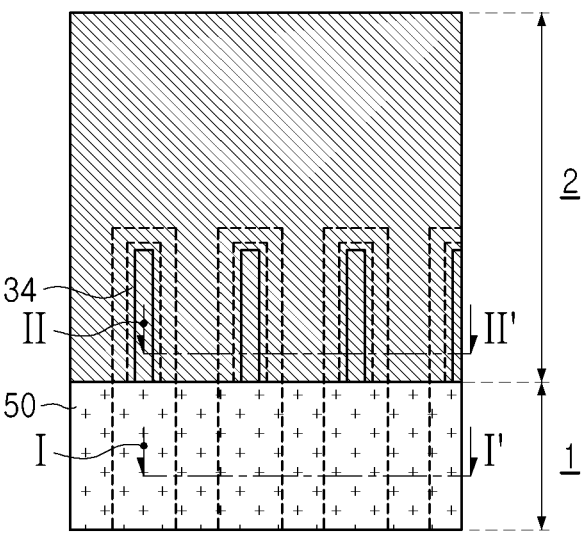
Figure 5B:
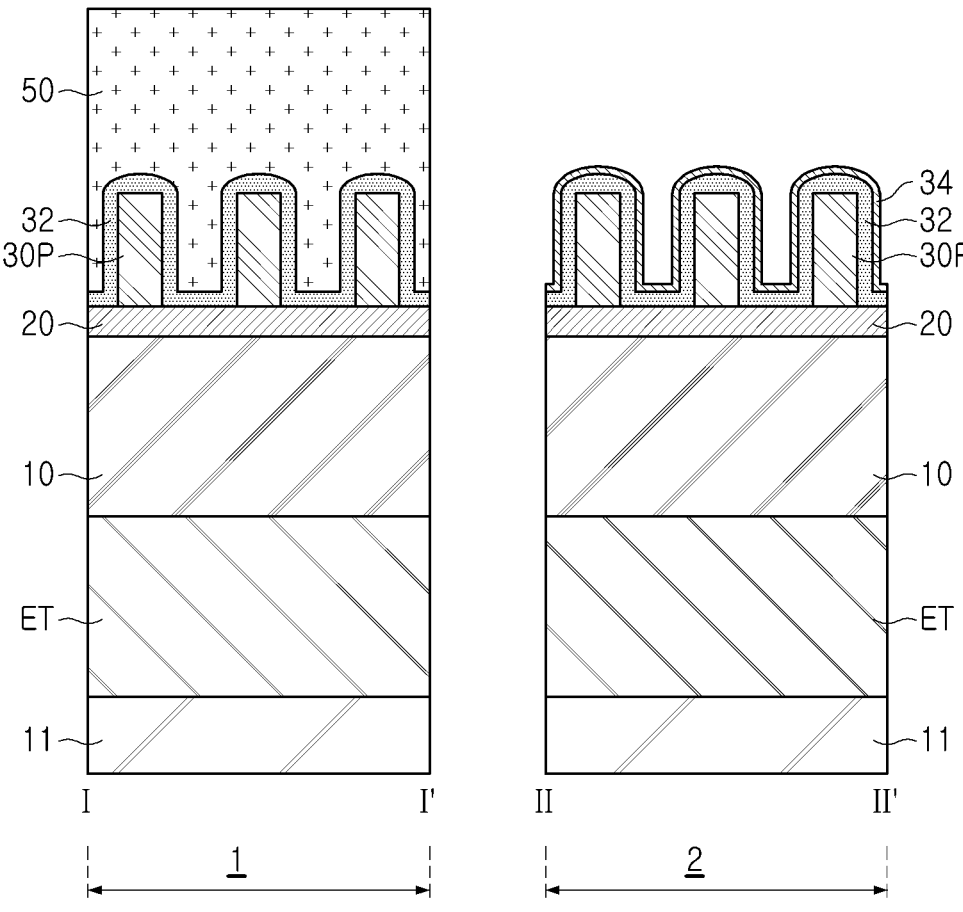

Referring to FIGS. 2, 5A, and 5B, a mask 50 covering the first spacer layer 32 on the first region 1 of the substrate 11 and exposing the first spacer layer 32 on the second region 2 of the substrate 11 may be formed, and then the second spacer layer 34 may be formed to cover the first spacer layer 32 on the second region 2 exposed by the mask 50 by a selective deposition (S4b).

The mask 50 may entirely cover the first region 1 of the substrate 11. The mask 50 may not be formed on the second region 2 of the substrate 11. The mask 50 may be in contact with the first spacer layer 32 on the first region 1 of the substrate 11 and may expose the first spacer layer 32 on the second region 2 of the substrate 11. The mask 50 may be formed of a material having an etch selectivity different from that of the plurality of mask layers 10, 20, and 30. For example, the mask 50 may be formed of photoresist.

The second spacer 34 may be formed by a selective deposition process of dielectric on dielectric to cover the first spacer layer 32 on the second region 2. Since the insulating material used for the deposition of the second spacer layer 34 has a greater affinity for the insulating material included in the first spacer layer 32 than the mask 50, the second spacer layer 34 may be deposited only on the surface of the first spacer layer 32. For example, the silicon oxide film forming the second spacer layer 34 may be selectively deposited only on the surface of the silicon oxide film forming the first spacer layer 32 on the second region 2. The second spacer layer 34 may include the same insulating material as the first spacer layer 32. The mask 50 and the selective deposition process may also be applied to the process of forming a device isolation layer defining an active region (see FIGS. 17 to 24). Alternatively, according to another example embodiment, the second spacer layer 34 may be formed by a selective deposition process of metal-on-metal with respect to the first spacer layer 32 on the second region 2, a selective deposition process of dielectric on metal, or a selective deposition process of metal on dielectric or dielectric on carbon, however, other combinations are also possible.

Figure 6A:
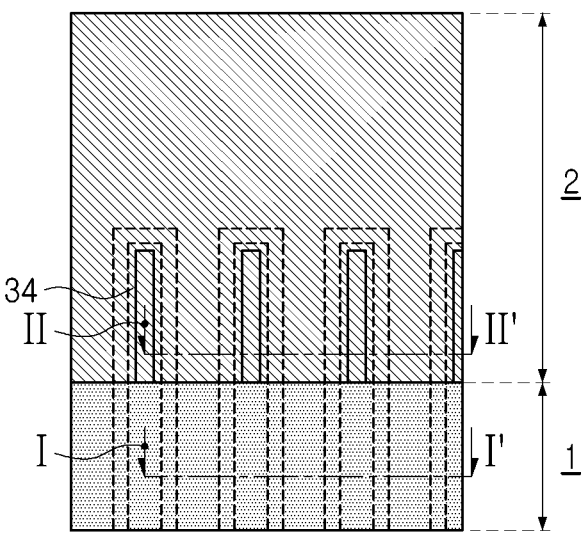
Figure 6B:
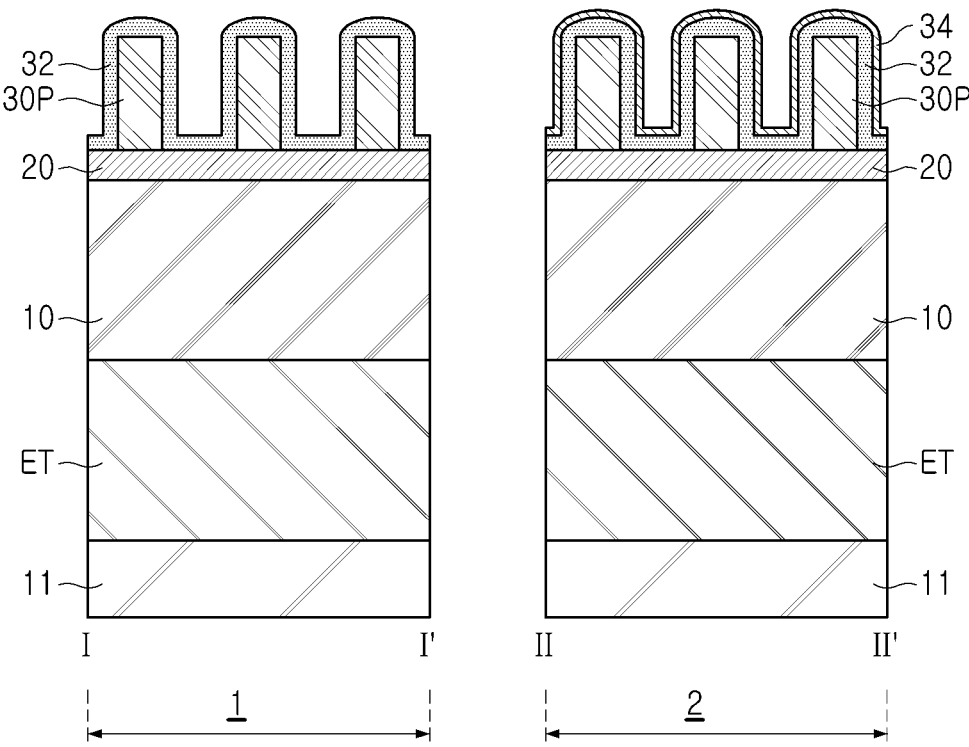

Referring to FIGS. 2, 6A, and 6B, the first spacer layer 32 may be exposed on the first region 1 by removing the mask 50 (S5). The mask 50 may be removed using, for example, a strip and/or ashing process. The mask 50 may be removed using the first spacer layer 32 as an etch stop layer. After the mask 50 is removed, the first spacer layer 32 may be exposed on the first region 1, and the second spacer 34 covering the first spacer layer 32 may be exposed on the second region 2.

Figure 7A:
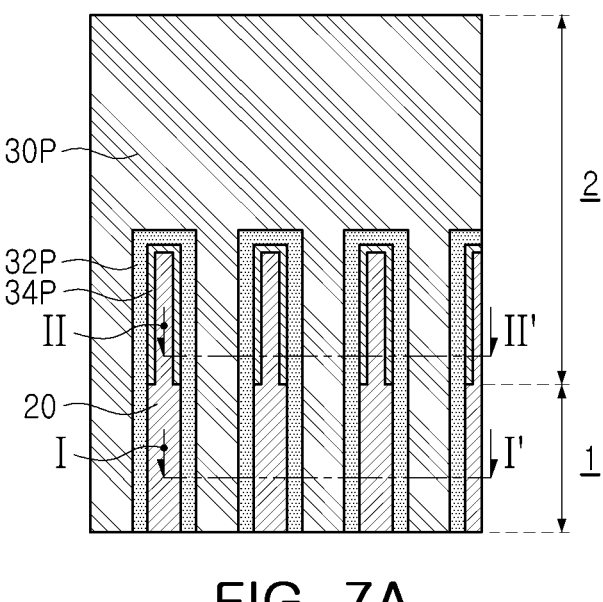
Figure 7B:
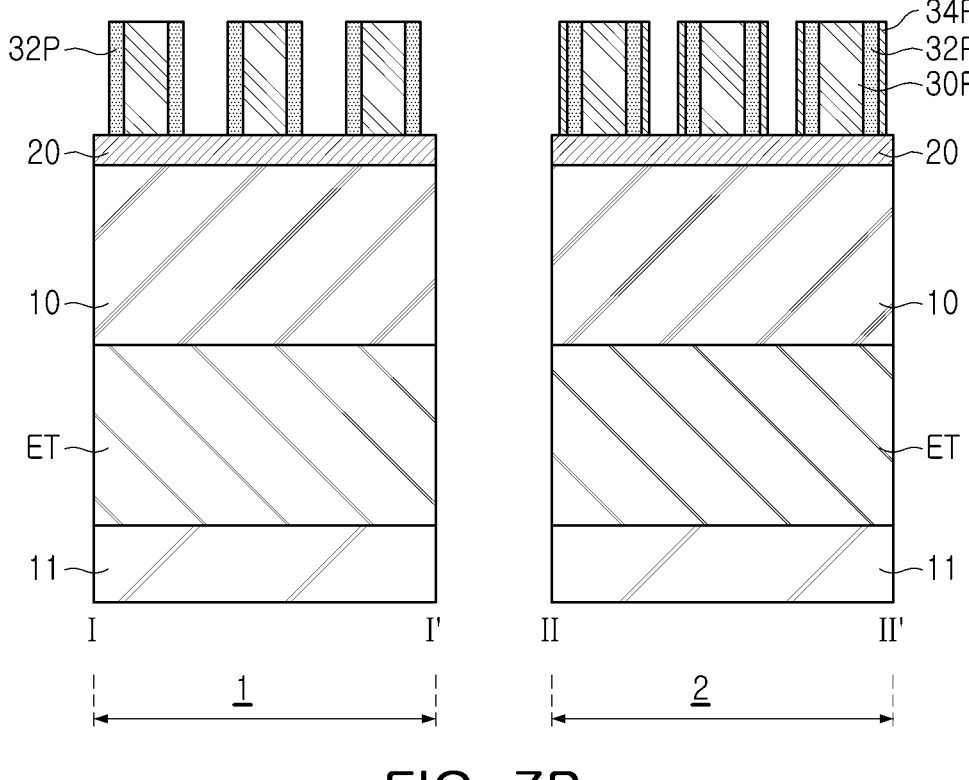

Referring to FIGS. 2, 7A, and 7B, the first spacer layer 32 on the first region 1 and the first spacer layer 32 and the second spacer layer 34 on the second region 2 may be etched (S6). In particular, the first spacer layer 32 and the second spacer layer 34 may be etched until the third mask patterns 30P are exposed. Portions of the first spacer layer 32 covering the second mask layer 20 and portions covering the upper surfaces of the third mask patterns 30P may be removed. Portions horizontally extending between the third mask patterns 30P of the second spacer layer 34 and portions disposed on the upper surfaces of the third mask patterns 30P may be removed. First spacer patterns 32P and second spacer patterns 34P may be formed by etching the first spacer layer 32 and the second spacer layer 34.

Figure 8A:
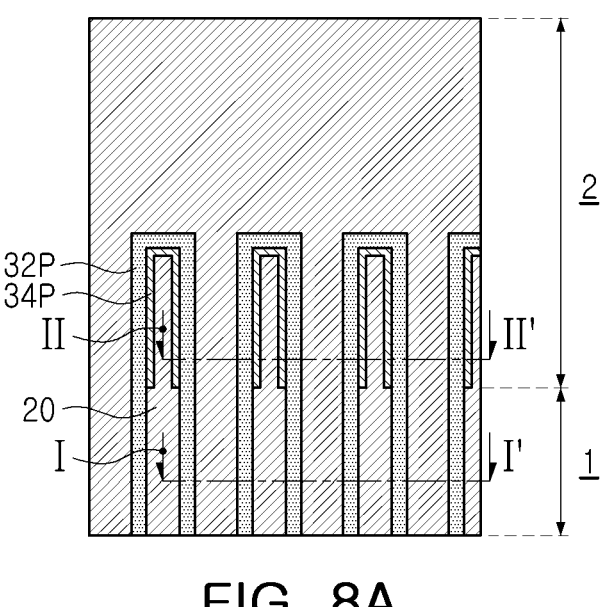
Figure 8B:
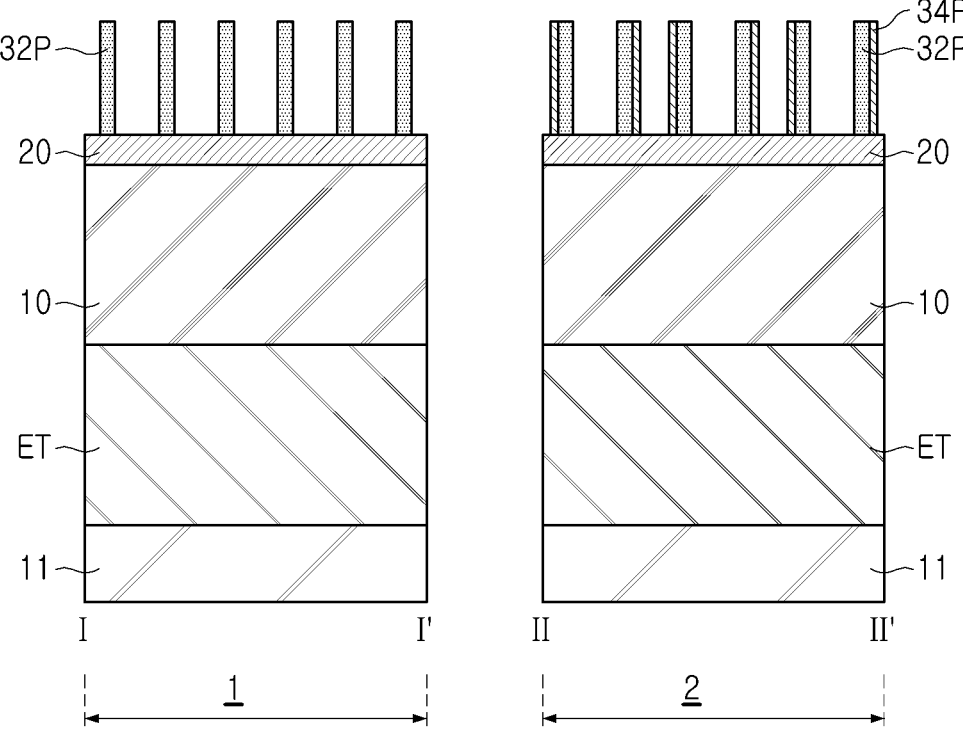

Referring to FIGS. 2, 8A, and 8B, the third mask patterns 30P may be removed (S7). The third mask patterns 30P may be selectively removed with respect to the first spacer patterns 32P and the second spacer patterns 34P. On the first region 1 and the second region 2, the first spacer patterns 32P may remain, and on the second region 2, the second spacer patterns 34P in contact with one sidewall of each of the first spacer patterns 32P may remain.

Figures 9A, 9B:
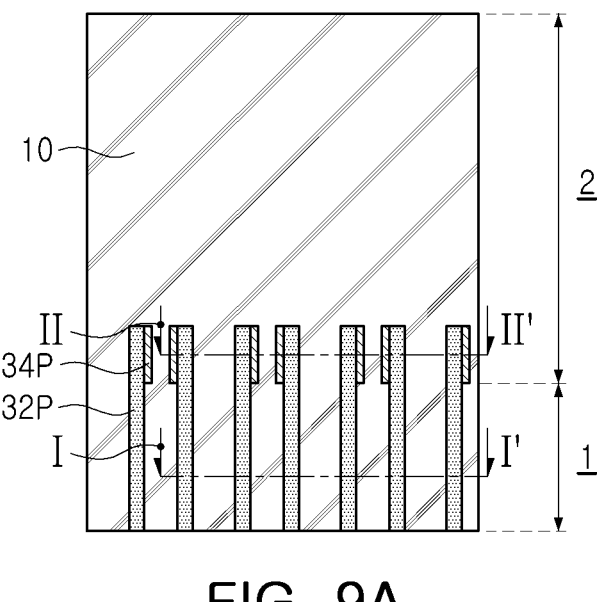

Referring to FIGS. 2, 9A, and 9B, second mask patterns 20P1 and 20P2 may be formed by etching the second mask layer 20 using the first spacer patterns 32P and the second spacer patterns 34P as an etching mask (S8). Thus, on the first region 1, the second mask layer 20 may be formed as second mask patterns 20P1 having a first width D1 corresponding to the first spacer patterns 32P, and the second mask layer 20 on the second region 2 may be formed as second mask patterns 20P2 having a second width D2 substantially equal to a sum of a width of the first spacer pattern 32P and a width of the second spacer pattern 34P. Accordingly, widths of the pattern portions according to the first and second regions 1 and 2 at the same pitch may be dualized. Ends of the first spacer patterns 32P and ends of the second spacer patterns 34P on the second region 2 may be removed in this process or after this process, and a portion of the second mask layer 20 below the ends may be removed from the second region 2.

Figure 10A:
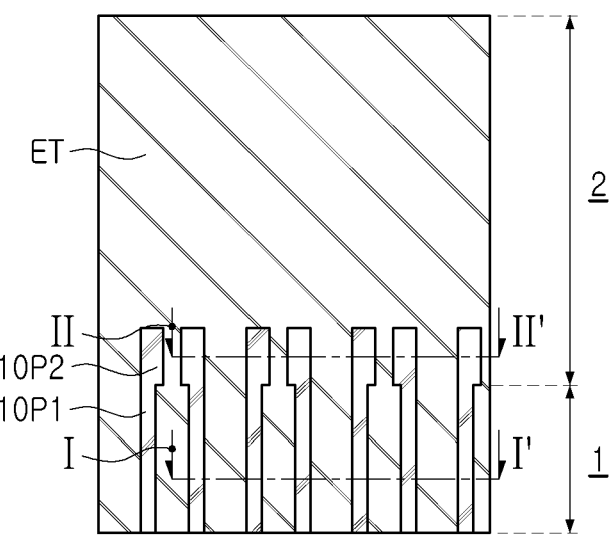
Figure 10B:
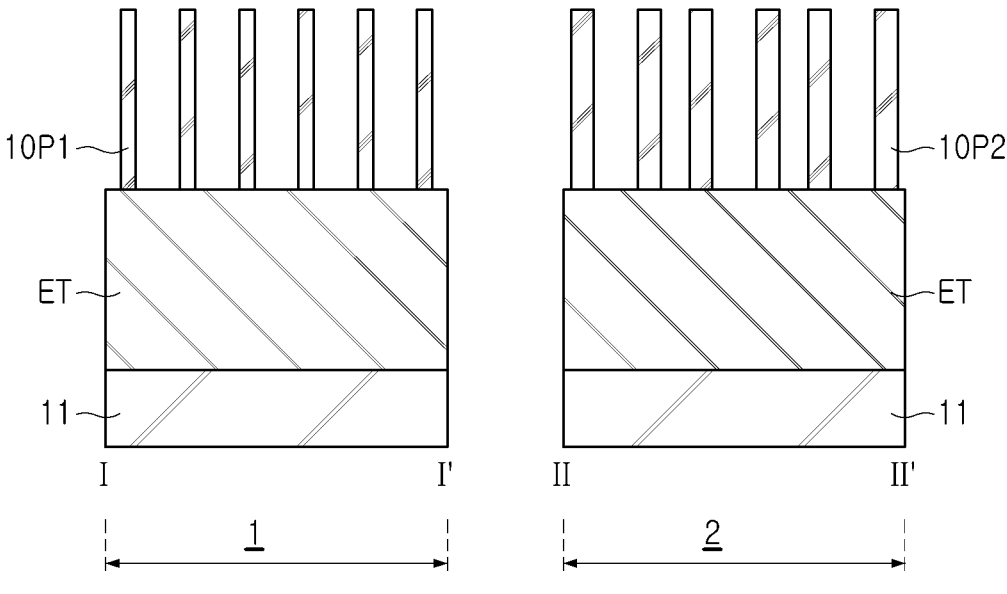
Figure 11A:
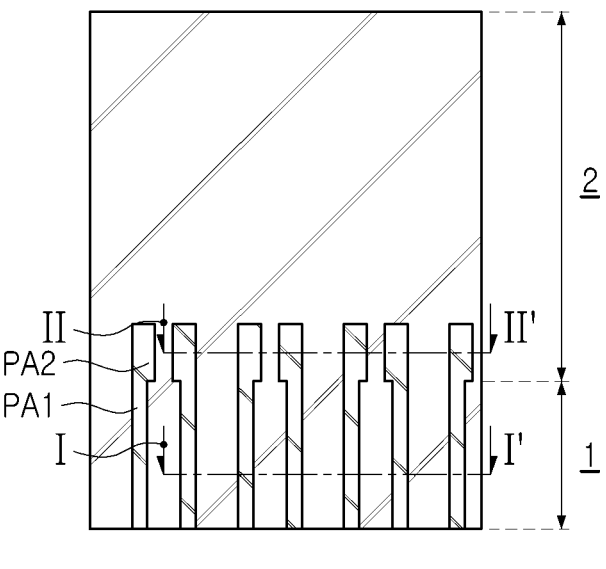
Figure 11B:
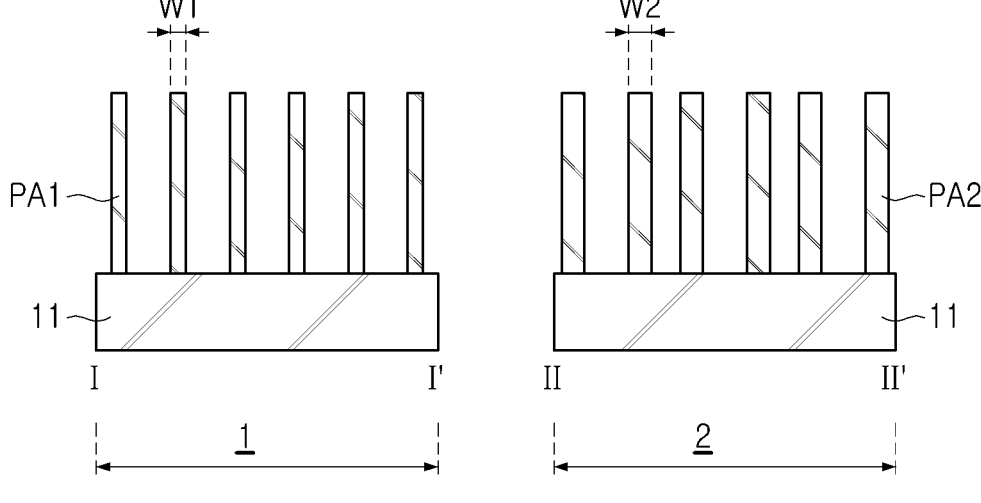

Referring to FIGS. 2, 10A, and 10B, the first mask patterns 10P1 and 10P2 may be formed by etching the first mask layer 10 using the second mask patterns 20P1 and 20P2 as an etching mask. Next, referring to FIGS. 2, 11A, and 11B, the etch target layer ET may be etched using the first mask patterns 10P1 and 10P2 as an etching mask (S9), which is the last process step illustrated by the flowchart of FIG. 1.

Advantageously, the first mask patterns 10P1 and 10P2 shown by FIG. 10B may be formed as pattern portions having different widths on the first and second regions 1 and 2. Accordingly, the etch target layer ET may be formed as pattern portions having different widths on the second regions 1 and 2. For example, the etch target layer ET may be etched and formed as relatively narrow first pattern portions PA1 on the first region 1 and relatively wide second pattern portions PA2 on the second region 2, such that the second width W2 of each of the second pattern portions PA2 may be greater than the first width W1 of each of the first pattern portions PA1. Nonetheless, a pitch between the first pattern portions PA1 may be substantially equal to a pitch between the second pattern portions PA2. The first spacer patterns 32P, the second spacer patterns 34P, and the third mask patterns 30P may be partially or entirely removed while the first mask layer 10 is etched or after the first mask layer 10 is etched. FIGS. 2 through 11B illustrates an example embodiment applied to double patterning technology, but an example embodiment thereof is not limited thereto, and the example embodiment may also be applied to a multi-patterning process, such as, for example, quadruple patterning technology.

Figures 12A, 12B:
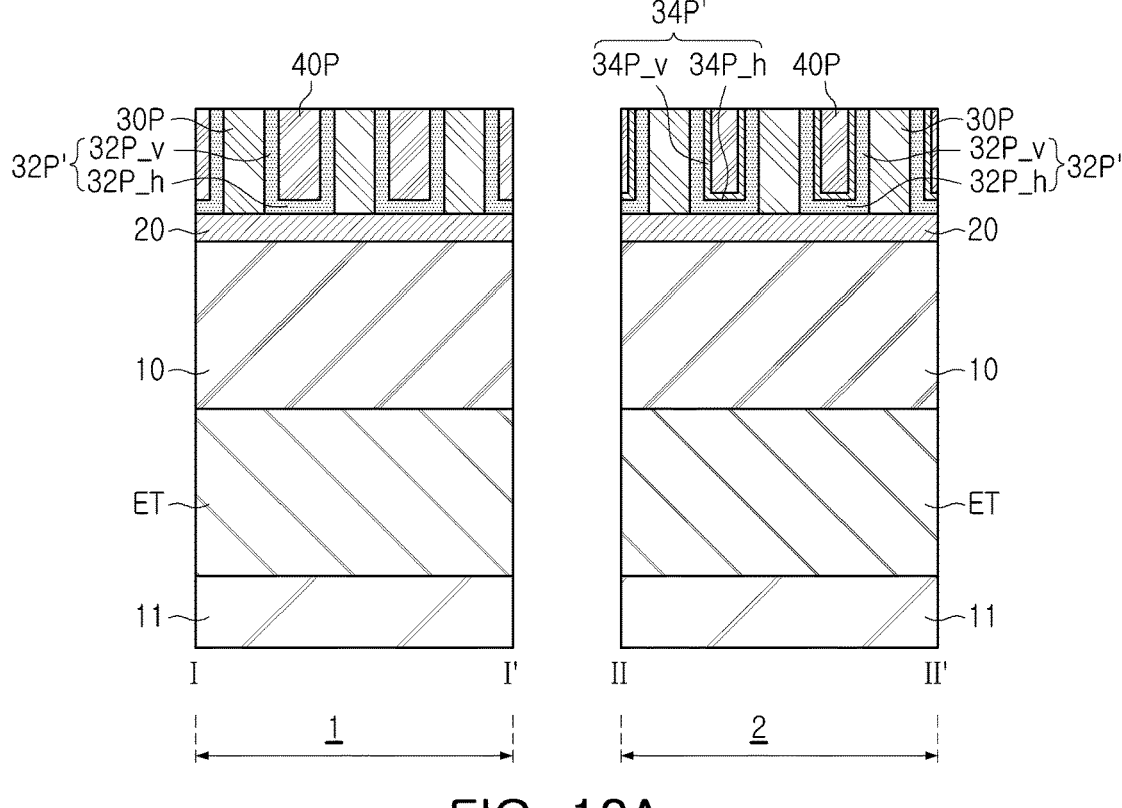
FIGS. 12A, 12B, and 13 are diagrams illustrating a method of manufacturing a semiconductor device according to an example embodiment of the present disclosure.
Figure 13:
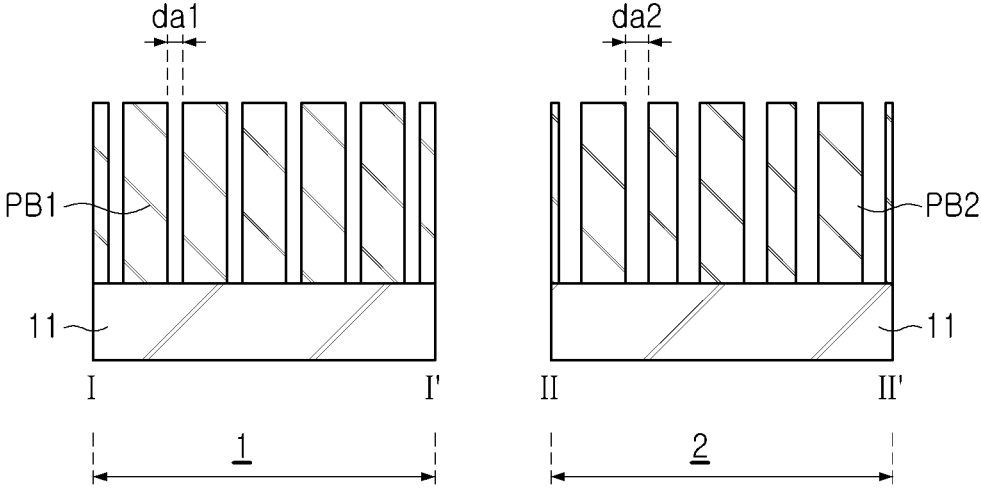

FIGS. 12A, 12B, and 13 are diagrams illustrating a method of manufacturing a semiconductor device according to an example embodiment, illustrating manufacturing processes subsequent to the manufacturing processes described with reference to FIGS. 2A to 6B. Referring to FIG. 12A, the forming the first spacer patterns 32P' and the second spacer patterns 34P' may include forming fourth mask patterns 40P filling a space between the third mask patterns 30P and etching the fourth mask patterns 40P, the first spacer layer 32, and the second spacer layer 34 until the third mask patterns 30P are exposed. The fourth mask patterns 40P may cover a sidewall of the first spacer layer 32 on the first region 1 and may cover a sidewall of the second spacer layer 34 on the second region 2. The first spacer layer 32 and the second spacer layer 34 may be etched and formed as first spacer patterns 32P' and second spacer patterns 34P'. Each of the first spacer patterns 32P' and the second spacer patterns 34P' may be formed on the second mask layer 20 to have a "U" shape. That is, the first spacer patterns 32P' may have a shape including the horizontal portions 32P_h and the vertical portions 32P_v connected to the horizontal portions 32P_h and extending in a direction perpendicular to the upper surface of the substrate 11, and the second spacer patterns 34P' may have a shape including the horizontal portions 34P_h and the vertical portions 34P_v connected to the horizontal portions 34P_h and extending in a direction perpendicular to the upper surface of the substrate 11.

Referring to FIG. 12B, the second mask layer 20 may be etched using the first spacer patterns 32P' and the second spacer patterns 34P'. The forming the second mask patterns 20P by etching the second mask layer 20 using the first spacer patterns 32P' and the second spacer patterns 34P' may include removing the vertical portions 32P_v of the first spacer patterns 32P' and the vertical portions 34P_v of the second spacer patterns 34P', and etching the second mask layer 20 using the fourth mask patterns 40P covering the respective horizontal portions 32P_h and 34P_h of the first spacer patterns 32P' and the second spacer patterns 34P' and the third mask patterns 30P covering the second mask layer 20. The second mask layer 20 may be etched and formed as second mask patterns 20P1' and 20P2'. A first distance ds1 of a space between the second mask patterns 20P1' on the first region 1 may be substantially equal to a width of the vertical portion 32P_v of the first spacer pattern 32P', and a second distance ds2 of a space between the second mask patterns 20P2' on the second region 2 may be substantially equal to a sum of a width of the vertical portion 32P_v of the first spacer pattern 32P' and a width of the second spacer pattern 34P'.

The second distance ds2 may be greater than the first distance ds1. Accordingly, distances of the space between the pattern portions may be dualized with each other according to the first and second regions 1 and 2 at the same pitch.

Thereafter, similarly to FIGS. 10A to 11B, first mask patterns may be formed by etching the first mask layer 10 using the second mask patterns 20P1' and 20P2', and an etch target layer ET may be etched using the first mask patterns. Distances between the pattern portions formed by etching the etch target layer may be different in the first and second regions 1 and 2. For example, as illustrated in FIG. 13, the etching target layer ET may be etched and formed as the first pattern portions PB1 of the first region 1 and the second pattern portions PB2 of the second region 2, and the second distance da2 between the second pattern portions PB2 may be greater than the first distance da1 between the first pattern portions PB1.

Figure 14:
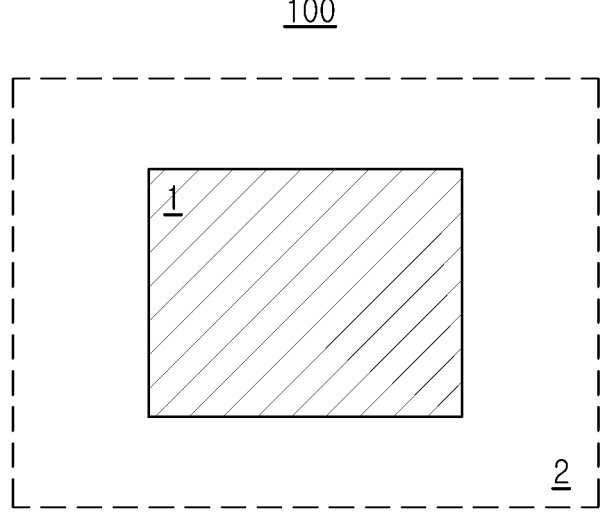
FIG. 14 is a plan diagram illustrating a semiconductor device according to an example embodiment of the present disclosure.
Figure 15:
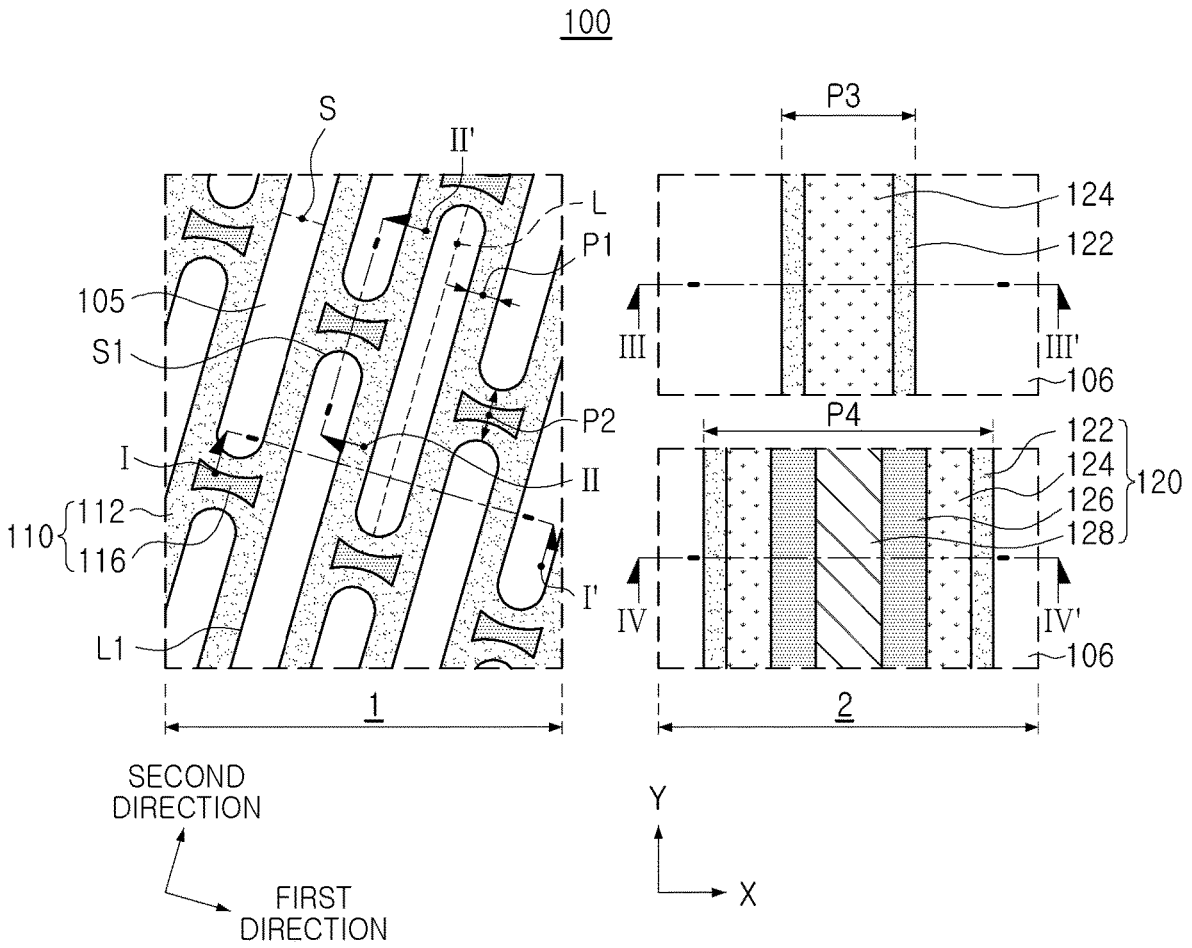
FIG. 15 is a plan diagram illustrating configurations of a first region 1 and a second region 2 in FIG. 14, respectively, according to an example embodiment of the present disclosure.

FIG. 14 is a plan diagram illustrating a semiconductor device according to an example embodiment, and FIG. 15 is a plan diagram illustrating configurations of a first region 1 and a second region 2 in FIG. 14, respectively, according to an example embodiment. In addition, FIG. 16 includes cross-sectional diagrams illustrating a semiconductor device taken along lines I-I', II-II', III-III', and IV-IV' in FIG. 15 according to an example embodiment.

Figure 16:
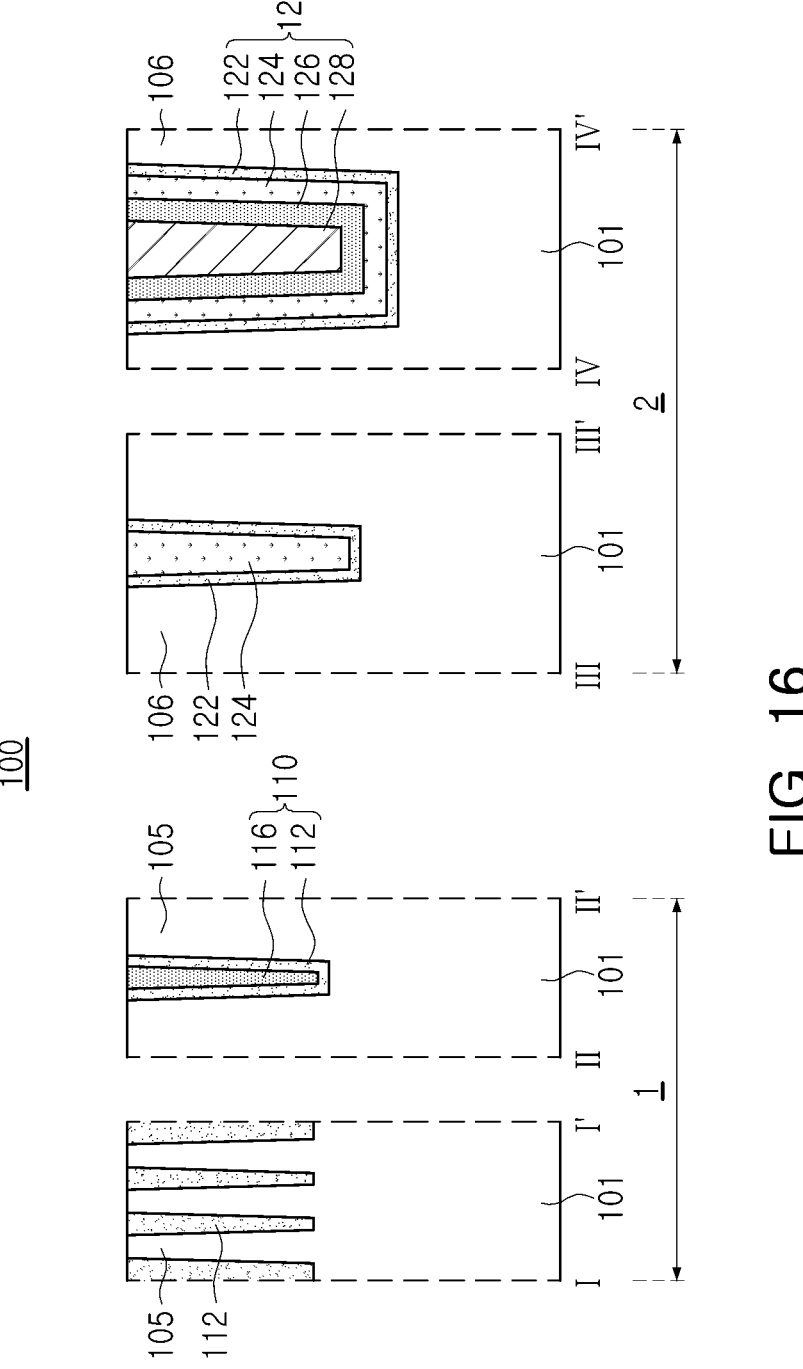
FIG. 16 includes cross-sectional diagrams illustrating a semiconductor device taken along lines I-I', II-II', III-III', and IV-IV' in FIG. 15, according to an example embodiment of the present disclosure.

Referring to FIGS. 14 to 16, a semiconductor device 100 may include a substrate 101 having a first region 1 and a second region 2 having different arrangement densities of active regions, a cell active regions 105 and a cell device isolation layer 110 in the first region 1 of the substrate 101, and peripheral active regions 106 and a peripheral device isolation layer 120 in the second region 2 of the substrate 101. The cell device isolation layer 110 may define cell active regions 105, and the peripheral device isolation layer 120 may define the peripheral active regions 106.

The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may include a silicon substrate, a silicon-on-insulator (SOI) substrate, a germanium substrate, a germanium-on-insulator (GOI) substrate, a silicon-germanium substrate, or an epitaxial layer.

The first region 1 of the substrate 101 may be configured as a high-density region including active regions having a relatively high arrangement density, and the second region 2 may be configured as a low-density region including active regions having a relatively low arrangement density. The arrangement density of the active regions may be understood as a degree to which the substrate 101 is patterned in a plan diagram, such as, for example, a degree to which an active region formed by etching the substrate 101 is dense.

The first region 1 of the substrate 101 may be configured as a memory cell array region of a semiconductor device. For example, a cell array of a dynamic random access memory (DRAM) may be disposed on the first region 1. In some example embodiments, a cell array including a NAND flash memory may be disposed on the first region 1 of the substrate 101. The first region 1 may be referred to as a "cell region".

In the second region 2 of the substrate 101, peripheral circuits electrically connected to the cell arrays disposed on the first region 1 may be disposed. The second region 2 may include a region in which a cell array is not disposed, such as a core region. Hereinafter, the "peripheral circuit region"

may refer to a region or a core region in which the peripheral circuits are formed. The second region 2 may be referred to as a "peripheral region".

FIG. 14 illustrates the example in which the first region 1 is surrounded by the second region 2, but an example embodiment thereof is not limited to the arrangement in FIG. 14. The first region 1 and the second region 2 may have an arrangement different from the example illustrated in FIG. 14.

The cell active region 105 may include an upper surface having a short axis S in the first direction and a long axis L in the second direction. The active region 105 may include a short sidewall S1 having the same width as that of the short axis S and a long sidewall L1 parallel to the long axis L. The short sidewall S1 may be configured to be curved, but an example embodiment thereof is not limited thereto.

A plurality of the cell active region 105 may be provided. The plurality of cell active regions 105 may be spaced apart from each other by a first width P1 in the first direction. The plurality of cell active regions 105 may be spaced apart from each other by a second width P2 greater than the first width P1 in the second direction. The plurality of cell active regions 105 may be repeatedly and regularly arranged in the first direction and the second direction. The plurality of cell active regions 105 may be alternately disposed to partially overlap each other in the first direction. The plurality of cell active regions 105 may be arranged linearly in the second direction.

In an example embodiment, the cell device isolation layer 110 may include a first isolation insulating layer 112 and a second isolation insulating layer 116. This first isolation insulating layer 112 may be disposed to be in contact with sidewalls of the plurality of cell active regions 105 between a plurality of cell active regions 105 spaced apart from each other. In addition, the first isolation insulating layer 112 may be in contact with the long sidewall L1 of the cell active region 105 and may continuously extend in the second direction. The first isolation insulating layer 112 may be in contact with the short sidewall S1 of the cell active region 105 and may continuously extend in the second direction.

The first isolation insulating layer 112 may fill a region between the plurality of cell active regions 105 spaced apart from each other by a first width P1 in the first direction. The first isolation insulating layer 112 may not entirely fill a region between the plurality of cell active regions 105 spaced apart from each other by a second width P2 in the second direction. The first isolation insulating layer 112 may include an insulating material, such as, for example, silicon oxide.

The second isolation insulating layer 116 may be disposed on the first isolation insulating layer 112 between the plurality of cell active regions 105 spaced apart from each other by a second width P2 in the second direction. A side surface and a lower surface of the second isolation insulating layer 116 may be surrounded by the first isolation insulating layer 112. The second isolation insulating layer 116 may fill a region not filled by the first isolation insulating layer 112 in a region between the plurality of cell active regions 105 spaced apart from each other by the second width P2 in the second direction. The second isolation insulating layer 116 may include an insulating material, such as, for example, silicon nitride.

A plurality of peripheral active regions 106 may be formed. Some of the plurality of peripheral active regions 106 may be spaced apart from each other by a relatively narrow third width P3. The others of the plurality of peripheral active regions 106 may be spaced apart from each other by a relatively wide fourth width P4. The fourth width P4 may be greater than the third width P3.

In an example embodiment, the peripheral isolation layer 120 may include a first peripheral insulating layer 122, a second peripheral insulating layer 124, a third peripheral insulating layer 126, and a fourth peripheral insulating layer 128. The first peripheral insulating layer 122 may be disposed to be in contact with a sidewall of the peripheral active region 106 between a plurality of peripheral active regions 106 spaced apart from each other. The first peripheral insulating layer 122 may be disposed between a plurality of peripheral active regions 106 spaced apart from each other by a third width P3. Also, the first peripheral insulating layer 122 may be disposed between the plurality of peripheral active regions 106 spaced apart from each other by the fourth width P4. As shown, a thickness of the first peripheral insulating layer 122 may be substantially equal to a thickness of the first isolation insulating layer 112. The first peripheral insulating layer 122 may include an insulating material, such as, for example, silicon oxide.

The second peripheral insulating layer 124 may be disposed on the first peripheral insulating layer 122 between a plurality of peripheral active regions 106 spaced apart from each other. The second peripheral insulating layer 124 may be disposed to be in contact with the first peripheral insulating layer 122. The second peripheral insulating layer 124 may fill a region not filled by the first peripheral insulating layer 122 in a region between the plurality of peripheral active regions 106 spaced apart from each other by the third width P3. Also, the second peripheral insulating layer 124 may be disposed to conformally cover the sidewall of the first peripheral insulating layer 122 in a region between the plurality of peripheral active regions 106 spaced apart from each other by a fourth width P4. A side surface and a lower surface of the second peripheral insulating layer 124 may be surrounded by the first peripheral insulating layer 122. The second peripheral insulating layer 124 may include an insulating material, such as, for example, silicon oxide. Advantageously, the hot electron induced punch-through phenomenon in the sub-word line driving region may be prevented by the first peripheral insulating layer 122 and the second peripheral insulating layer 124 formed of silicon oxide, according to some embodiments of the invention.

The third peripheral insulating layer 126 may be disposed on the second peripheral insulating layer 124 between the plurality of peripheral active regions 106 spaced apart from each other by the fourth width P4. The third peripheral insulating layer 126 may be disposed to be in contact with the second peripheral insulating layer 124 between the plurality of peripheral active regions 106 spaced apart from each other by the fourth width P4. A sidewall and a lower surface of the third peripheral insulating layer 126 may be surrounded by the second peripheral insulating layer 124. A thickness of the third peripheral insulating layer 126 may be substantially equal to a thickness of the second isolation insulating layer 126. The third peripheral insulating layer 126 may include an insulating material, such as, for example, silicon nitride.

The fourth peripheral insulating layer 128 may be disposed on the third peripheral insulating layer 126 between the plurality of peripheral active regions 106 spaced apart from each other by the fourth width P4. The fourth peripheral insulating layer 128 may be disposed to be in contact with the third peripheral insulating layer 126. The fourth peripheral insulating layer 128 may fill a region not filled by the first to third peripheral insulating layers 122, 124, and 126 between the plurality of peripheral active regions 106 spaced apart from each other by the fourth width P4. The fourth peripheral insulating layer 128 may include an insulating material, such as, for example, silicon oxide.

Figure 17:
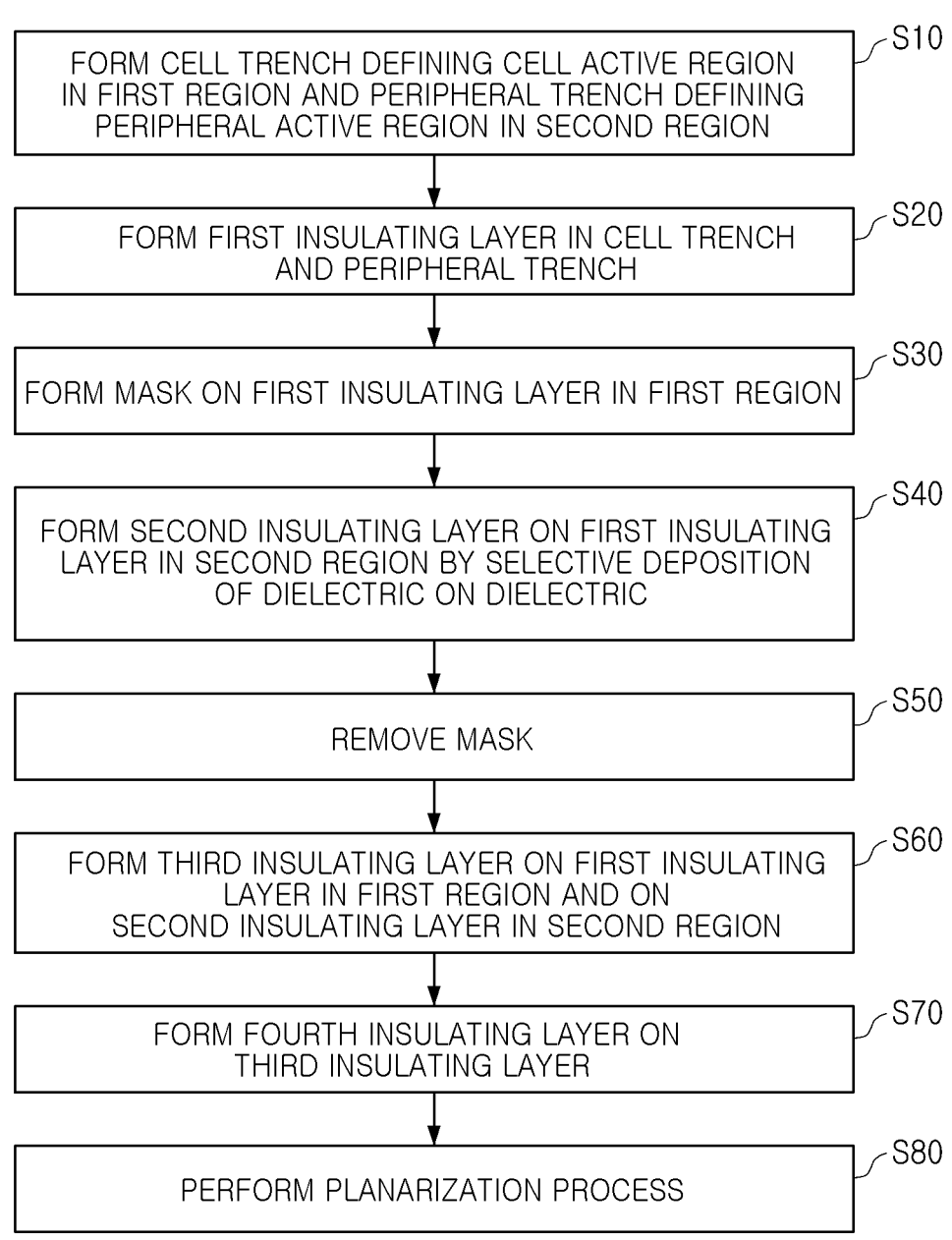
FIG. 17 is a flowchart illustrating processes of a method of manufacturing a semiconductor device in sequence according to an example embodiment of the present disclosure.

FIG. 17 is a flowchart illustrating processes of a method of manufacturing a semiconductor device in sequence according to an example embodiment, and FIGS. 18 to 24 are cross-sectional diagrams illustrating a semiconductor device according to an example embodiment.

Figure 18:
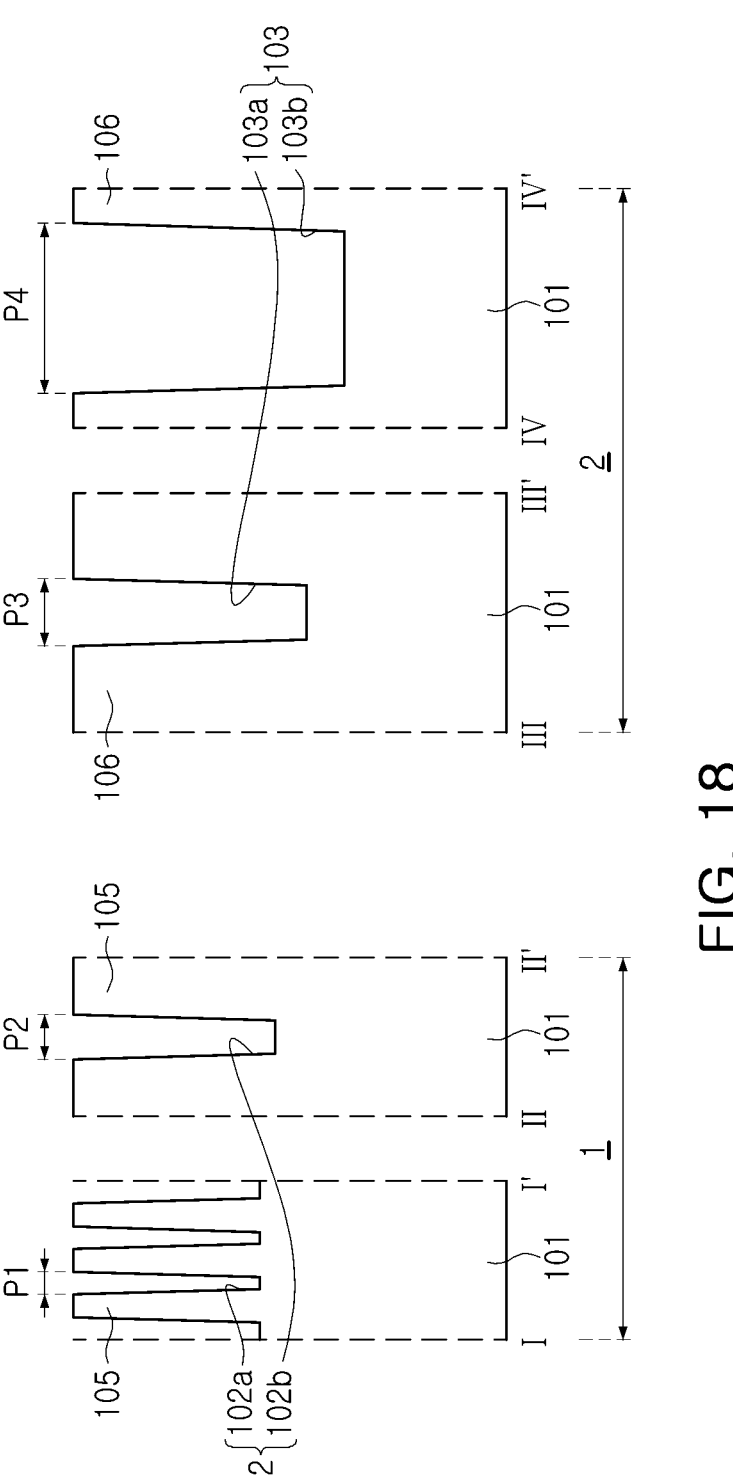
FIGS. 18 to 24 are cross-sectional diagrams illustrating a semiconductor device according to an example embodiment of the present disclosure.

Referring to FIGS. 17 and 18, a substrate 101 having a first region 1 and a second region 2 having different arrangement densities of active regions may be prepared, and the cell trench 102 defining the cell active regions 105 in the first region 1 and the peripheral trench 103 defining the peripheral active regions 106 in the second region 2 may be formed (S10). A depth of the cell trench 102 may be formed to be narrower than a depth of the peripheral trench 103 of the second region 2 due to a loading effect and/or reactive ion etching (RIE) lag in the etching process.

The cell trench 102 may include a first cell trench portion 102a having a relatively narrow width P1 and a second cell trench portion 102b having a relatively wide width P2. For example, the second width P2 of the second cell trench portion 102b may be greater than the first width P1 of the first cell trench portion 102a. A depth of the first cell trench portion 102a may be different from a depth of the second cell trench portion 102b. For example, the depth of the second cell trench portion 102b may be formed to be greater than the depth of the first cell trench portion 102a by the RIE lag.

The peripheral trench 103 may include a first peripheral trench portion 103a having a relatively narrow width P3 and a second peripheral trench portion 103b having a relatively large width P4. A fourth width P4 of the second peripheral trench portion 103b may be greater than a third width P3 of the first peripheral trench portion 103a. A depth of the first peripheral trench portion 103a may be different from a depth of the second cell trench portion 103b. For example, the depth of the second cell trench portion 103b may be formed to be greater than the depth of the first peripheral trench portion 103a by the RIE lag.

A critical dimension (CD) of the peripheral trench 103 may be related to reduction of a feature size of the semiconductor device. Accordingly, in the sub-word line driving region of the peripheral circuit region, the peripheral device isolation layer may be formed of an oxide to maintain electrical properties between individual adjacent devices of the semiconductor device. In order for the peripheral isolation layer to be formed of oxide, a process for preventing the first peripheral trench portion 103a from being filled with nitride may be necessary.

Figure 19:
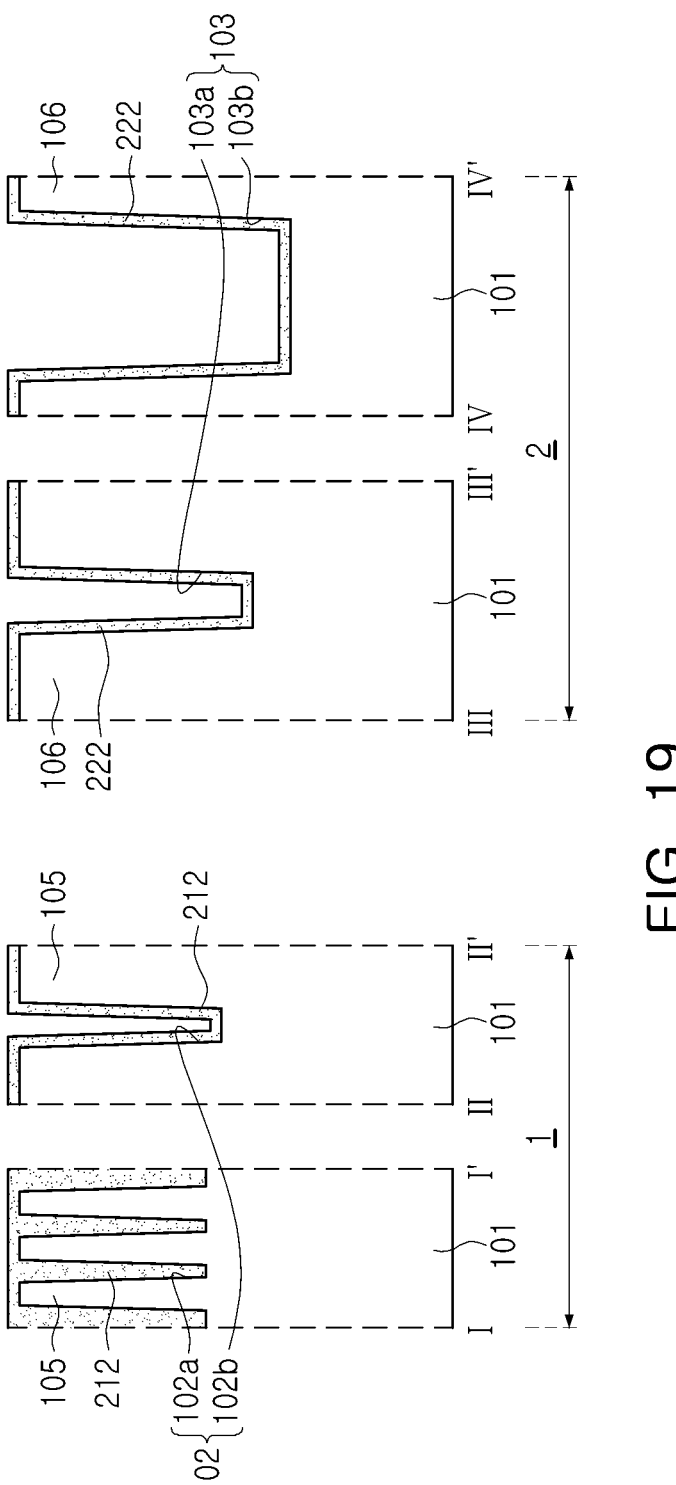

Referring to FIGS. 17 and 19, first insulating layers 212 and 222 may be formed in the cell trench 102 and the peripheral trench 103 in the first region 1 and the second region 2 (S20). As shown, the first insulating layers 212 and 222 may be formed on a surface of the cell trench 102 and a surface of the peripheral trench 103. The first insulating layer 212 of the first region 1 may be formed to fill the first cell trench portion 102a and to not entirely fill the second cell trench portion 102b. The first insulating layer 222 of the second region 2 may be formed without entirely filling the first peripheral trench portion 103a and the second peripheral trench portion 103b.

For example, the cell trench 102 may have a seam within the first insulating layer 212 as a result of a deposition process. In the cell trench 102, a void caused by the seam may be present in the first insulating layer 212.

The first insulating layers 212 and 222 may conformally cover the second cell trench portion 102b and internal walls of the peripheral trench 103. For example, the first insulating layers 212 and 222 may be configured to reduce consumption by oxidation of the cell active region 105 during an oxidation process of a subsequent process and to secure a necessary region of the cell active region 105, thereby improving switching properties of the cell transistors. For example, the first insulating layers 212 and 222 may be formed of silicon oxide. The first insulating layers 212 and 222 may be formed using an atomic layer deposition (ALD) process, a chemical vapor deposition (CVD) process, a radical oxidation process, or a natural oxidation process.

Figure 20:
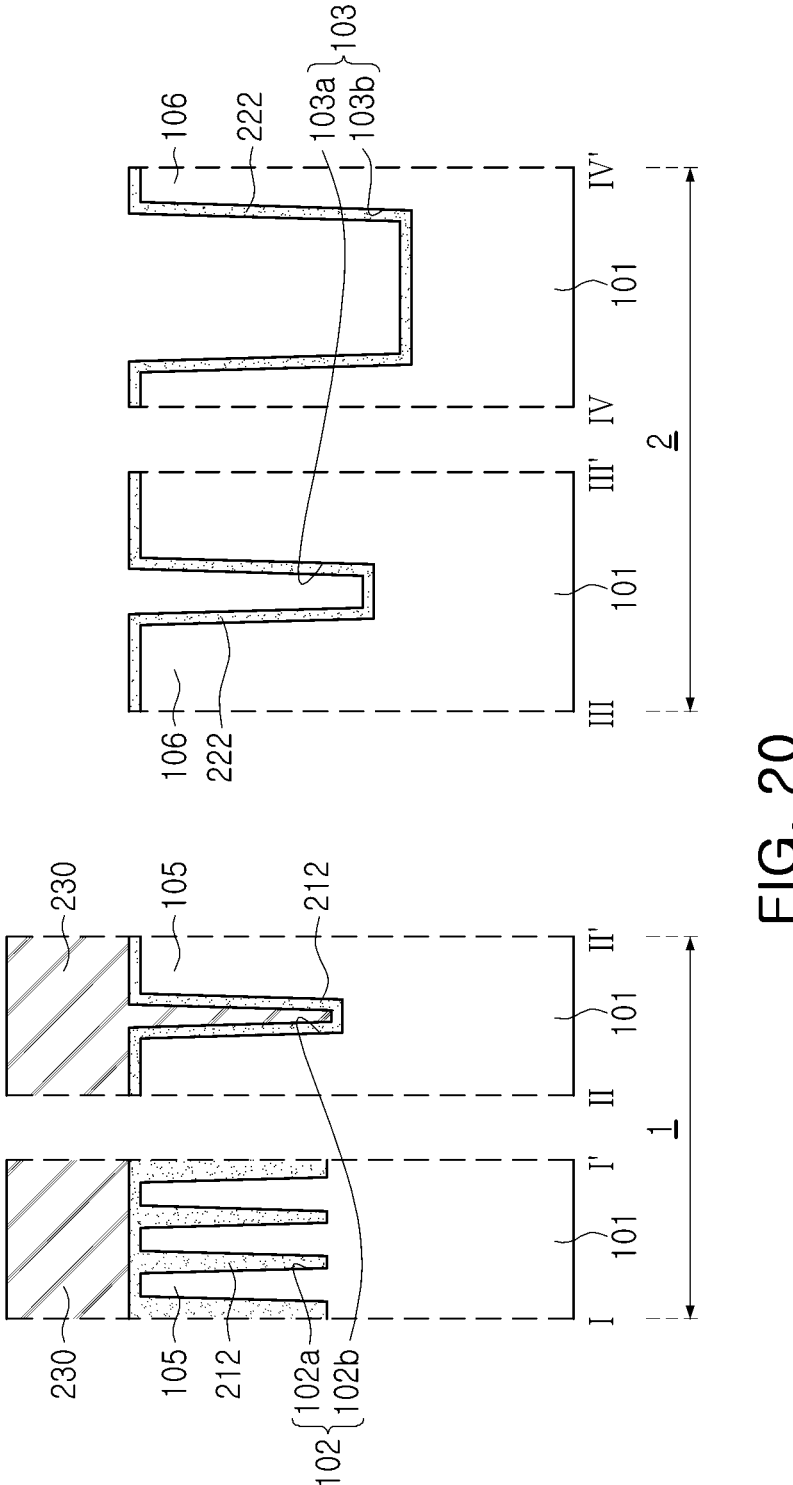

Referring to FIGS. 17 and 20, a mask 230 may be formed on the first insulating layer 212 in the first region 1 (S30). The mask 230 may entirely cover the first region 1 of the substrate 101. The mask 230 may be in contact with the first insulating layer 212 in the second cell trench portion 102b in the first region 1. The mask 230 may cover the first insulating layer 212 in the first region 1 and may expose the first insulating layer 222 in the second region 2. The mask 230 may not be formed in the second region 2 of the substrate 101. The mask 230 may be formed of a material having selectivity different from that of the first insulating layers 212 and 222. For example, the mask 230 may be formed of photoresist.

Figure 21A:
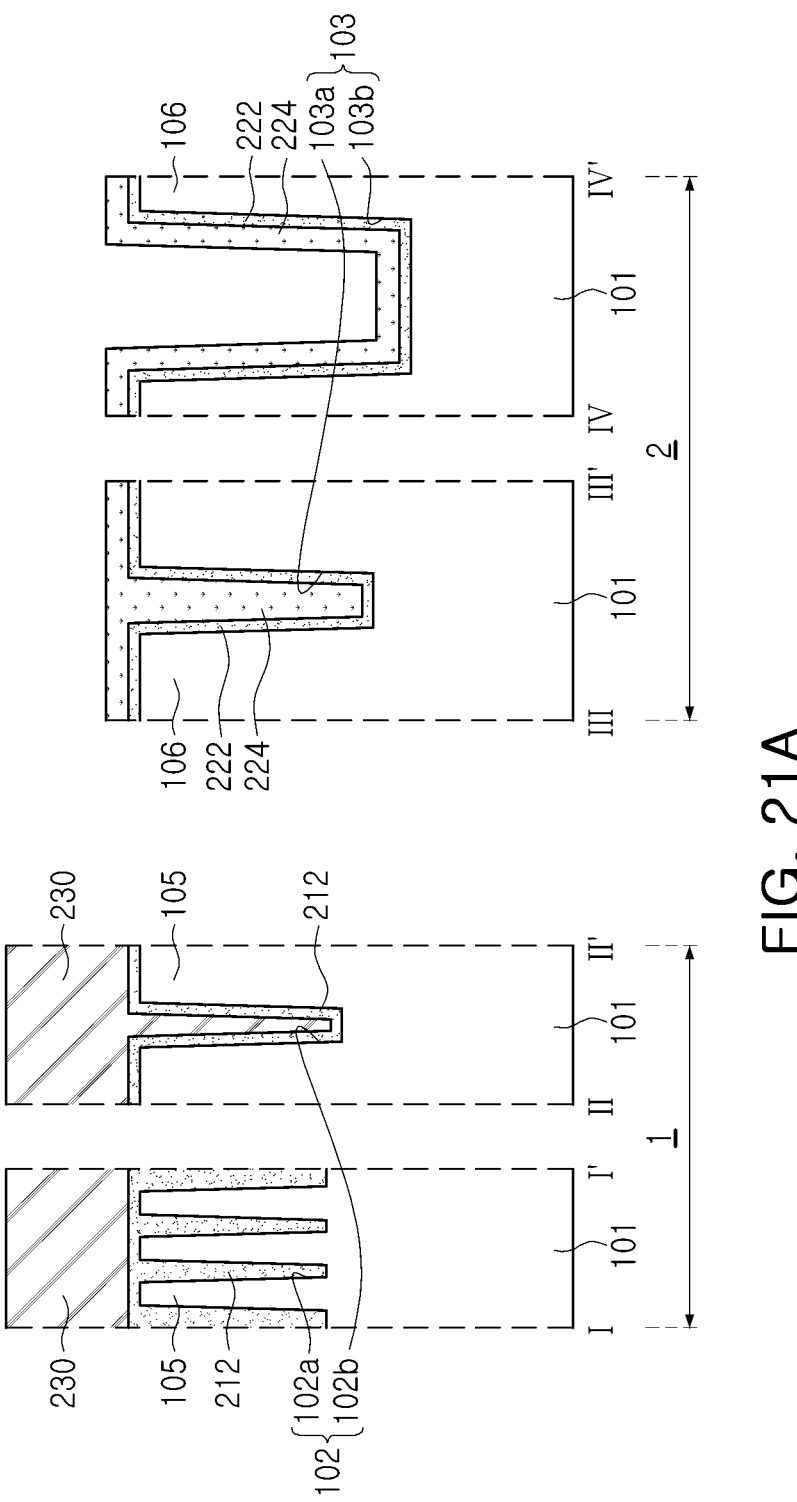

Referring to FIGS. 17 and 21A, the second insulating layer 224 may be formed on the first insulating layer 222 in the second region 2 by a selective deposition method of depositing a dielectric on a dielectric (S40). The second insulating layer 224 may be selectively deposited only in the second region 2. For example, the second insulating layer 224 may be formed to be in contact with the first insulating layer 222 in the second region 2, and may not be formed on the first insulating layer 212 and the mask 230 in the first region 2. The second insulating layer 224 may be formed to not cover the mask 230. When the second insulating layer 224 is formed by a general deposition method, a process of removing the second insulating layer 224 covering the mask 230 may need to be performed. Since the second insulating layer 224 is not formed on the mask 230, a process of removing the second insulating layer 224 covering the mask 230 may not be performed.

Since the insulating material used for the deposition of the second insulating layer 224 has a greater affinity for the insulating material forming the first insulating layer 222 than the mask 230, the second insulating layer 224 may be deposited only on the surface of the first insulating layer 222 in the second region 2. For example, the silicon oxide film forming the second insulating layer 224 may be selectively deposited only on the surface of the silicon oxide film forming the first insulating layer 222 in the second region 2. The second insulating layer 224 may include the same insulating material as that of the first insulating layers 212 and 222.

Figure 21B:
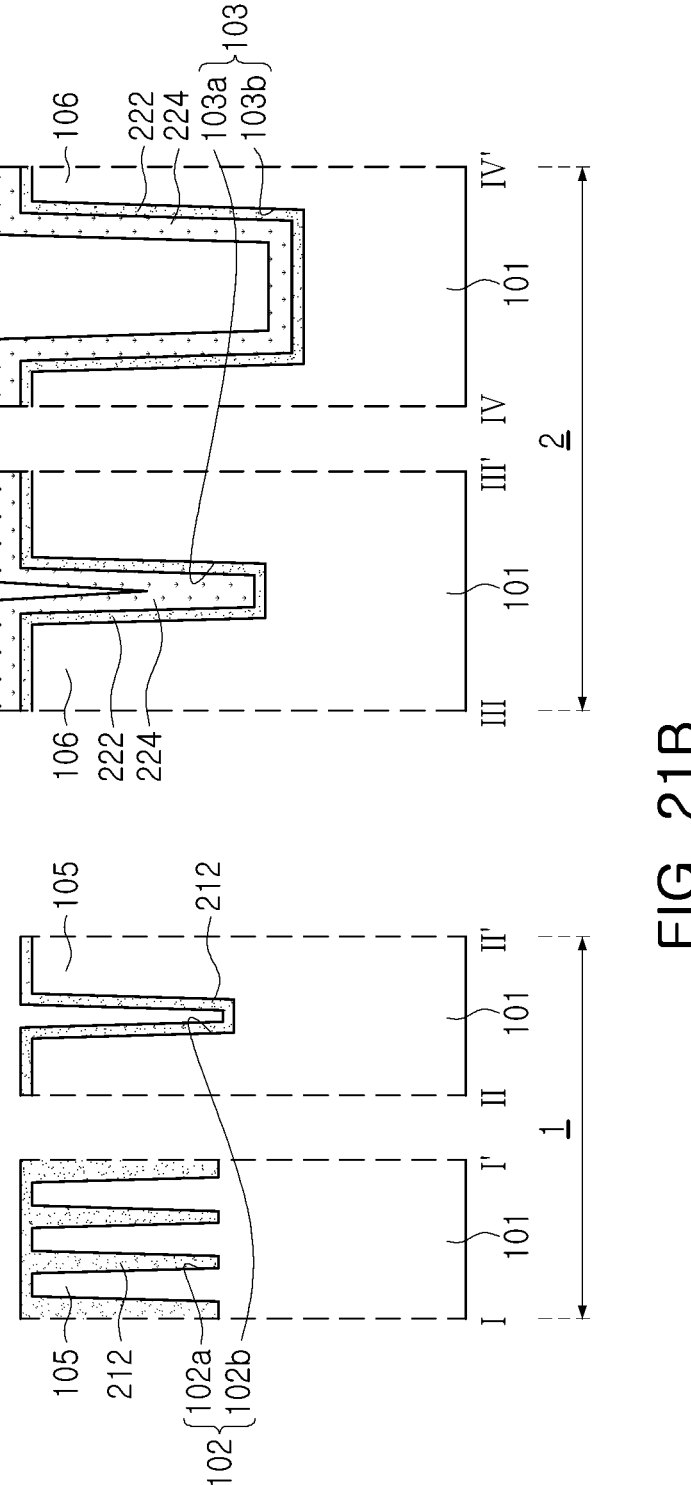

The second insulating layer 224 may be in contact with the first insulating layer 222 in the first peripheral trench portion 103a and may fill the first peripheral trench portion 103a, and may not entirely fill the second peripheral trench portion 103b. However, as illustrated in FIG. 21B, the second insulating layer 224 may be formed without entirely filling the first peripheral trench portion 103a. Since the second insulating layer 224 fills the first peripheral trench portion 103a, a liner including nitride may not be formed in the first peripheral trench portion 103a in a subsequent process. Accordingly, to form the peripheral device isolation layer using oxide in the sub-word line driving region of the peripheral circuit region, a process of removing nitride formed in the first peripheral trench portion 103a may not be performed. Also, in this case, to remove nitride, it may not be necessary to secure a space for removing nitride in the first peripheral trench portion 103a.

After the forming the second insulating layer 224, the second insulating layer 224 in the first peripheral trench portion 103a may not be removed. Prior to the process of forming the second insulating layer 224, the first insulating layer 222 in the first peripheral trench portion 103a may not be removed. That is, during the manufacturing processes of the semiconductor device, the first insulating layer 222 and the second insulating layer 224 formed in the first peripheral trench portion 103a may remain without being removed. For example, a seam may be present in the first peripheral trench portion 103a within the second insulating layer 224 as a result of the deposition process. A void caused by the seam may be present in the second insulating layer 224 in the first peripheral trench portion 103a.

The second insulating layer 224 may conformally cover a sidewall of the first insulating layer 222 within the second peripheral trench portion 103b. The second insulating layer 224 may be surrounded by a side surface and a lower surface by the first insulating layer 222 in the peripheral trench 103.

Figure 22:
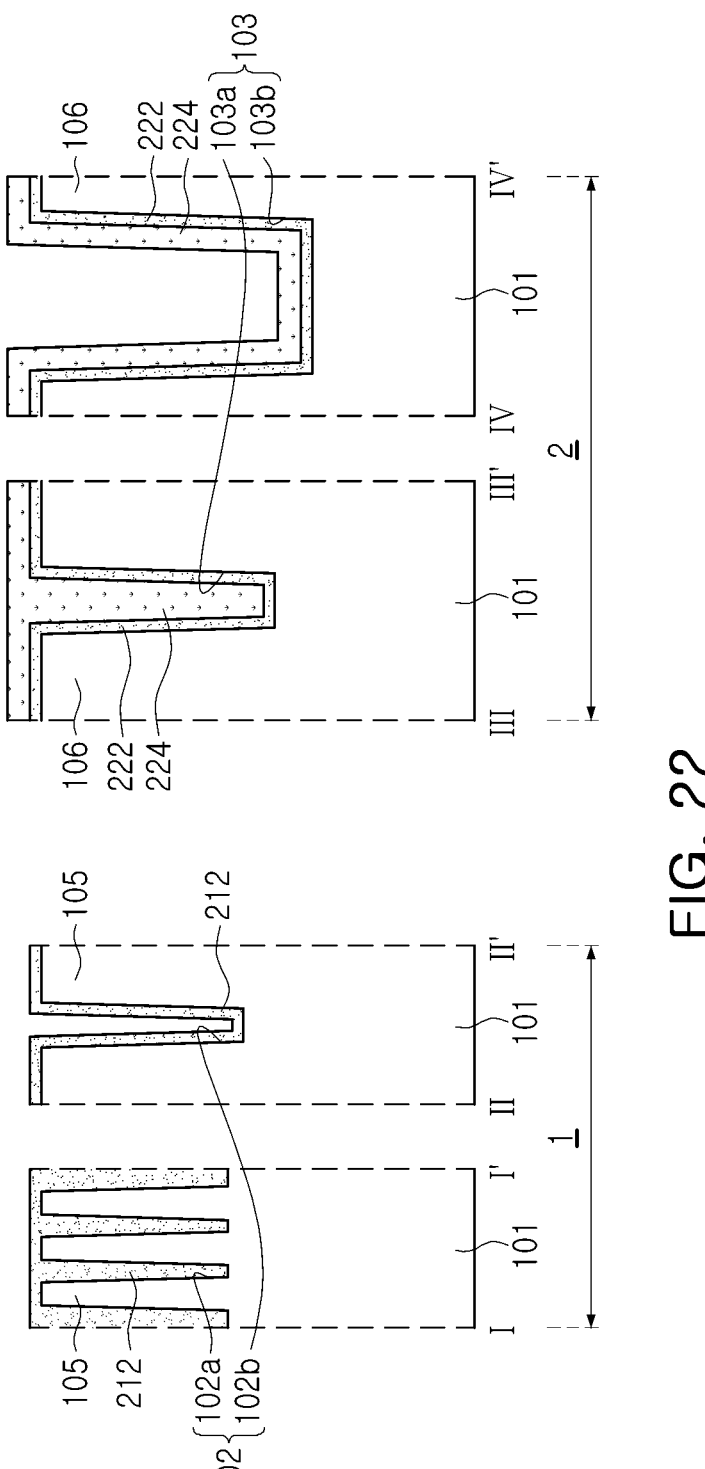

Referring to FIGS. 17 and 22, the mask 230 may be removed from the first region 1 (S50). For example, the mask 230 may be removed through a strip and/or ashing process. The mask 230 may be removed using the first insulating layers 212 and 222 as an etch stop layer. After the mask 230 is removed, the first insulating layer 212 may be exposed in the first region 1, and the second insulating layer 224 covering the first insulating layer 222 may be exposed in the second region 2.

Figure 23A:
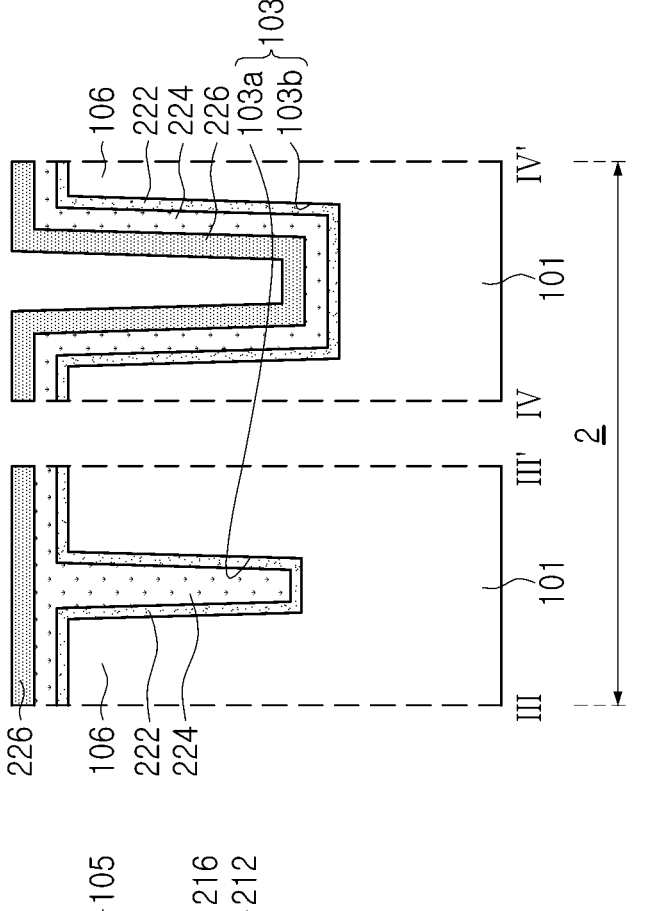
Figure 23A:
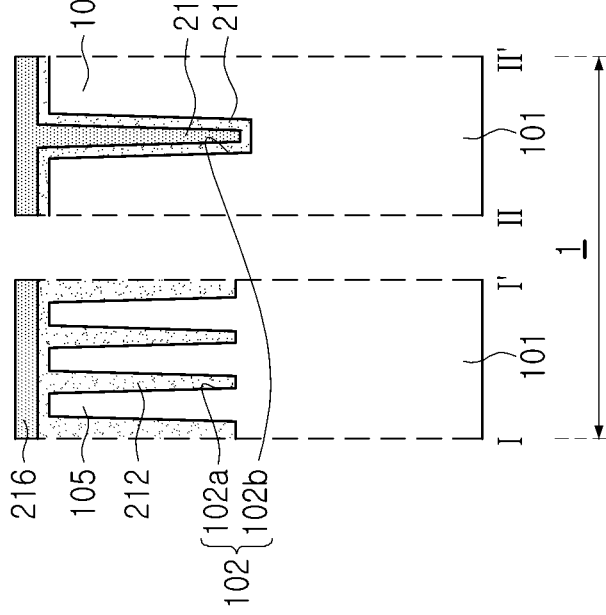

Referring to FIGS. 17 and 23A, a third insulating layer 216 and 226 may be formed on the first insulating layer 212 in the first region 1 and the second insulating layer 224 in the second region 2 (S60). In the first region 1, the third insulating layer 216 may be formed to fill the second cell trench portion 102b. The third insulating layer 226 in the second region 2 may be formed without entirely filling the second peripheral trench portion 103b. In the second region 2, a third insulating layer 226 may be conformally formed on a sidewall of the second insulating layer 224 in the second peripheral trench portion 103b. For example, the third insulating layer 226 may be surrounded by the second insulating layer 224 on the side surface and the lower surface in the second peripheral trench portion 103b. The third insulating layers 216, 226 may extend from the first region 1 to the second region 2.

Figure 23B:
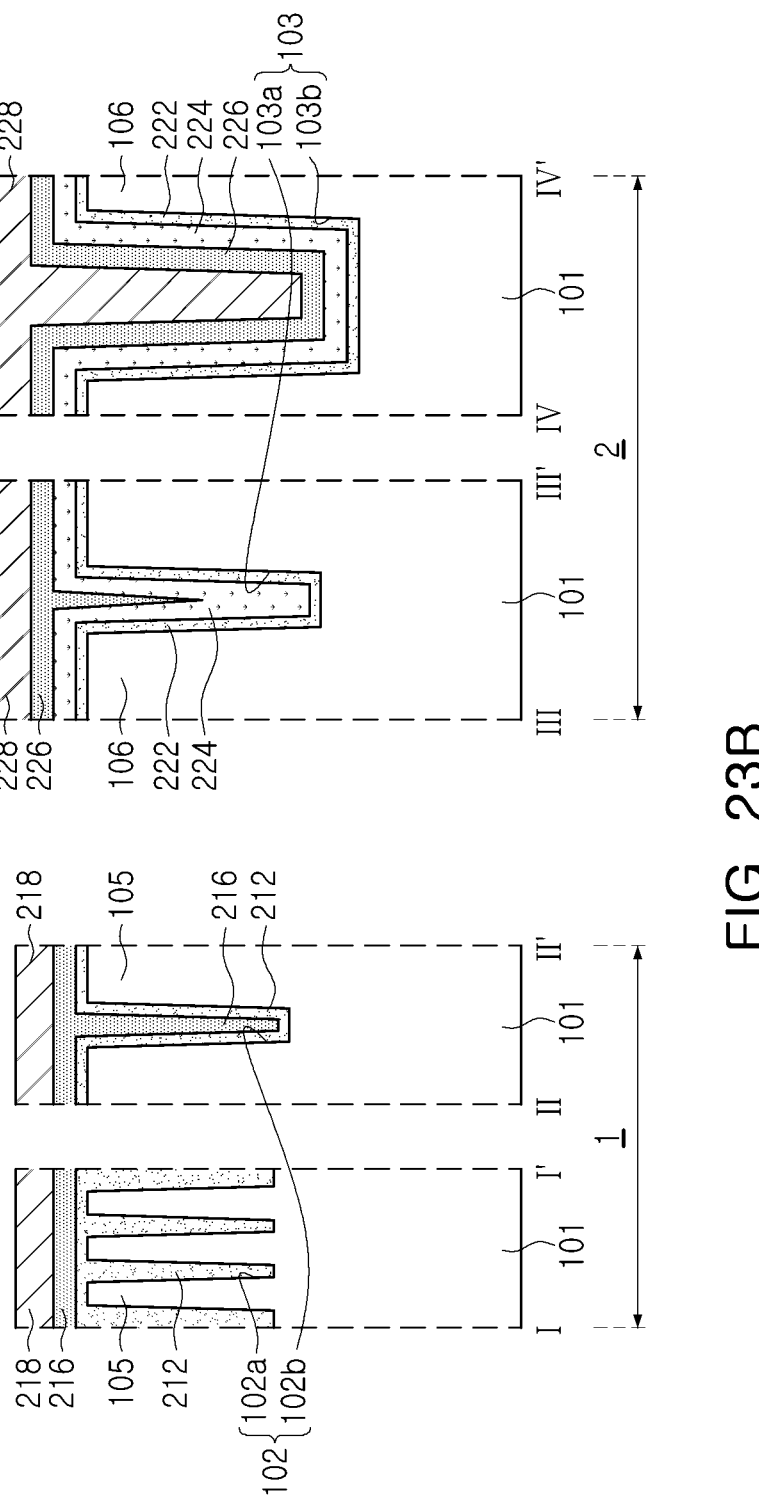

Since the first peripheral trench portion 103a in the second region 2 may be filled by the second insulating layer 224 described above, the third insulating layer 226 including silicon nitride may not formed on the first peripheral trench portion 103a. The upper surface of the third insulating layer 226 in the second region 2 may be formed to be disposed on a level higher than a level of the upper surface of the third insulating layer 216 in the first region 1. However, in the manufacturing process in FIG. 21B, when the second insulating layer 224 partially fills the first peripheral trench portion 103a, as illustrated in FIG. 23B, the third insulating layer 226 including silicon nitride 226 may fill the first peripheral trench portion 103a and may be formed to be in contact with the internal wall of the second insulating layer 224 in the first peripheral trench portion 103a.

The third insulating layers 216 and 226 may be formed of an insulating material different from that of the first insulating layers 212 and 222 and the second insulating layer 224. For example, the third insulating layers 216 and 226 may be formed of silicon nitride. The third insulating layers 216 and 226 may be formed through an ALD process or a CVD process. A seam may be present in the third insulating layer 216 in the second cell trench portion 102b. A void caused by the shim may be present in the third insulating layer 216 in the second cell trench portion 102b.

Figure 24:
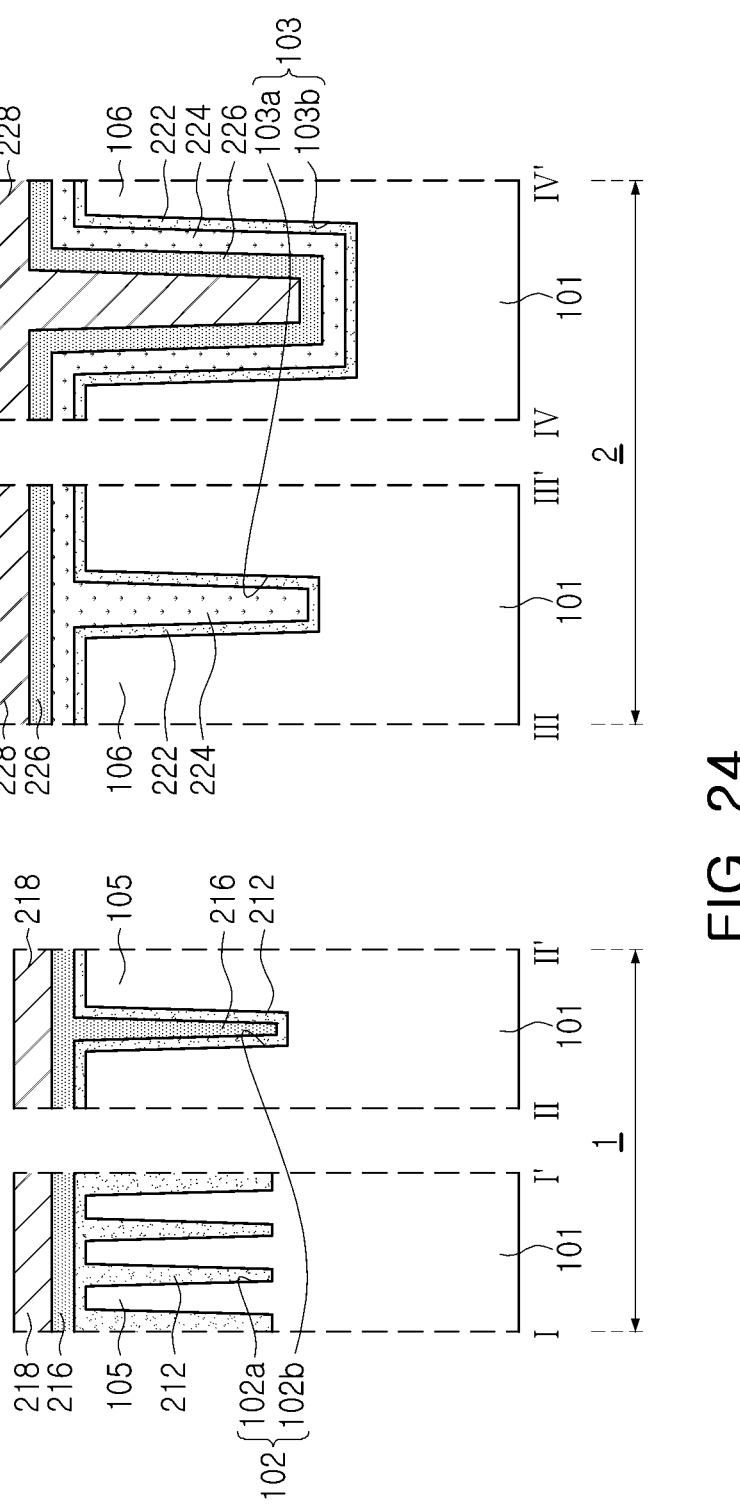

Referring to FIGS. 17 and 24, fourth insulating layers 218 and 228 may be formed on the third insulating layer 226 (S70). A fourth insulating layer 228 in the second region 2 may be formed to be in contact with the third insulating layer 226 in the second peripheral trench portion 103b and to fill the second peripheral trench portion 103b. A side surface and a lower surface of the fourth insulating layer 228 may be surrounded by a third insulating layer 226 in the second peripheral trench portion 103b.

For example, a seam may be present within the fourth insulating layer 228 as a result of the deposition process in the second peripheral trench 103b. A void caused by the shim may be present in the fourth insulating layer 228 in the second peripheral trench 103b.

Referring to FIGS. 16 and 17, a portion of layers stacked on the surface of the substrate 101 may be removed by performing a blanket planarization process (S80), such as a chemical-mechanical polishing (CMP) process. The planarization process may be performed until the surface of the substrate 101 is exposed. By the planarization process, the first insulating layer 212, the third insulating layer 216, and the fourth insulating layer 218 on the surface of the substrate 101 in the first region 1 may be removed, such that the cell device isolation layer 110 including the first isolation insulating layer 112 and the second isolation insulating layer 116 may be formed as illustrated in FIG. 16 (left side). In addition, based on the planarization process, the first insulating layer 222, the second insulating layer 224, the third insulating layer 226, and the fourth insulating layer 228 on the surface of the substrate 101 in the second region 2 may be removed, such that a peripheral device isolation layer 120 including the first peripheral insulating layer 122, the second peripheral insulating layer 124, the third peripheral insulating layer 126, and the fourth peripheral insulating layer 128 may be formed as illustrated in FIG. 16 (right side).

Thereafter, referring to FIGS. 25 to 27B below, a gate trench (see FIG. 26C) crossing the cell active regions 105 may be formed in the substrate 101 of the first region 1, and a gate (see "404" in FIG. 26C) including a word line may be formed in the gate trench. The gate may be included in a gate of a buried channel array transistor (BCAT). A peripheral gate (see "480" in FIG. 27A) may be formed on the peripheral active regions 106 of the second region 2. A bit line structure (see "420" in FIG. 26A) extending in a direction intersecting the gate may be formed on the gate in the first region 1.

Figure 25:
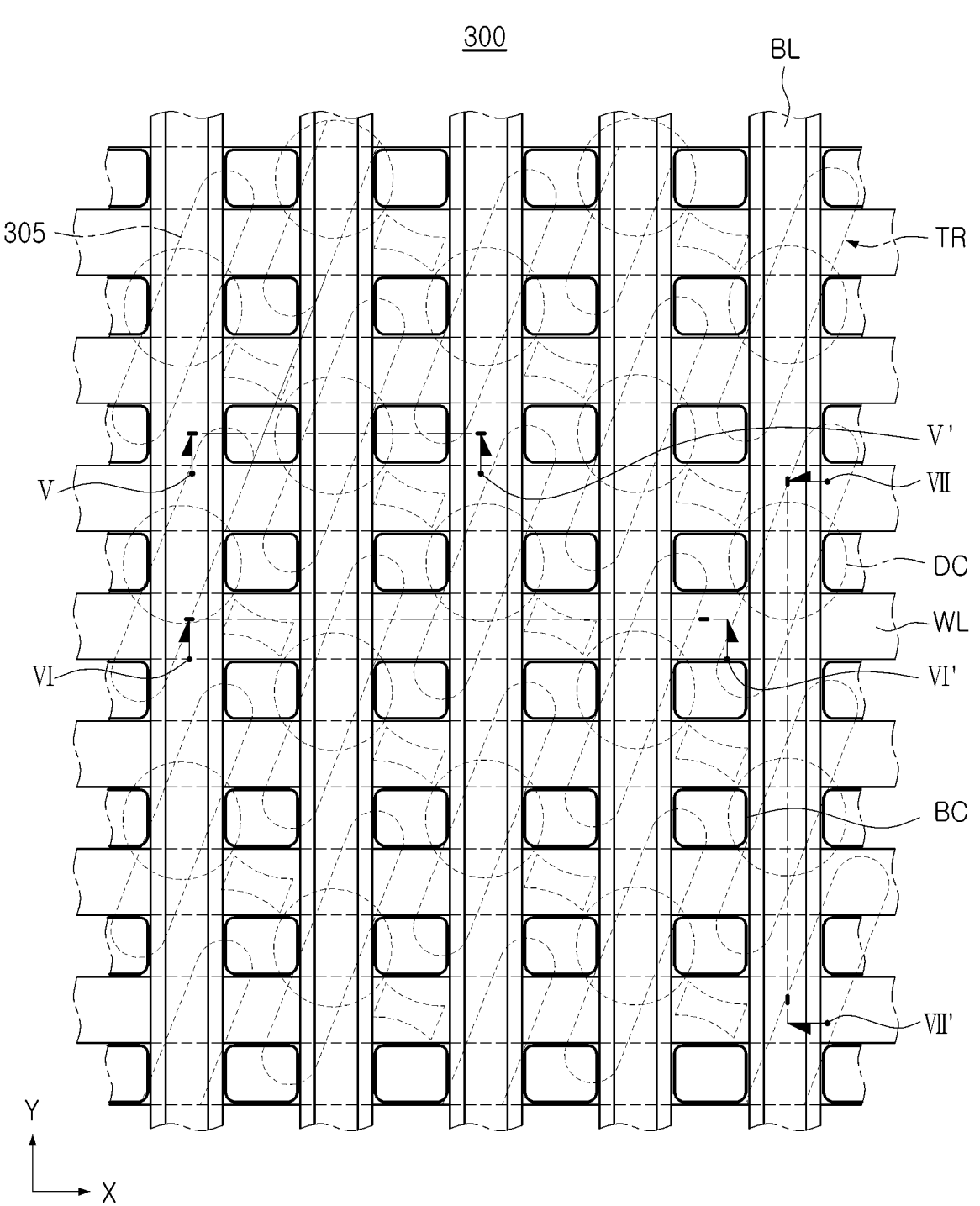
FIG. 25 is a plan diagram illustrating a semiconductor device according to an example embodiment of the present disclosure.
Figure 26A:
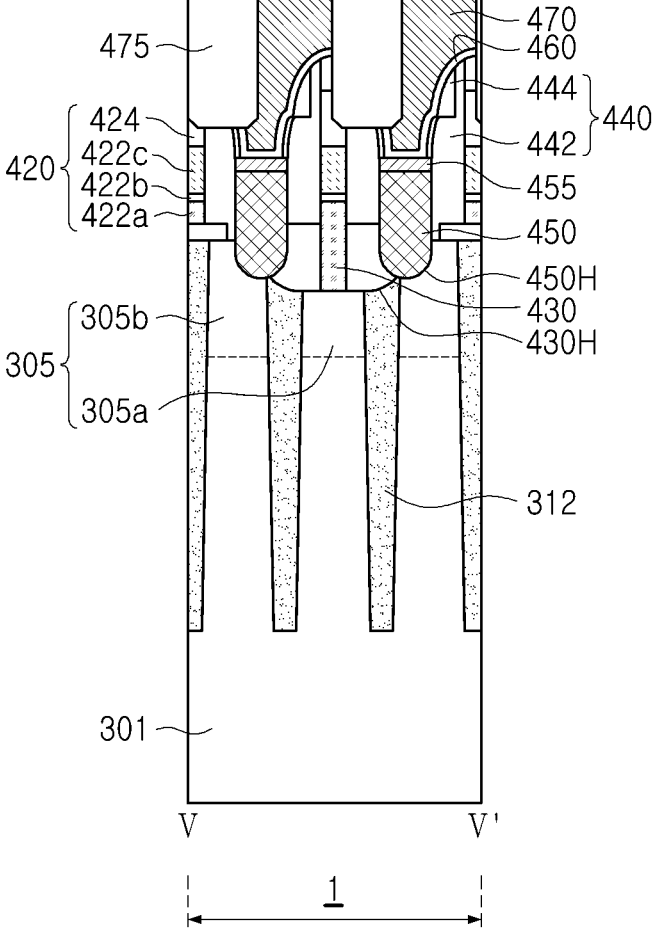
FIGS. 26A, 26B, and 26C are cross-sectional diagrams illustrating a semiconductor device taken along lines V-V', VI-VI', and VII-VII' in FIG. 25 according to an example embodiment of the present disclosure.
Figure 26B:
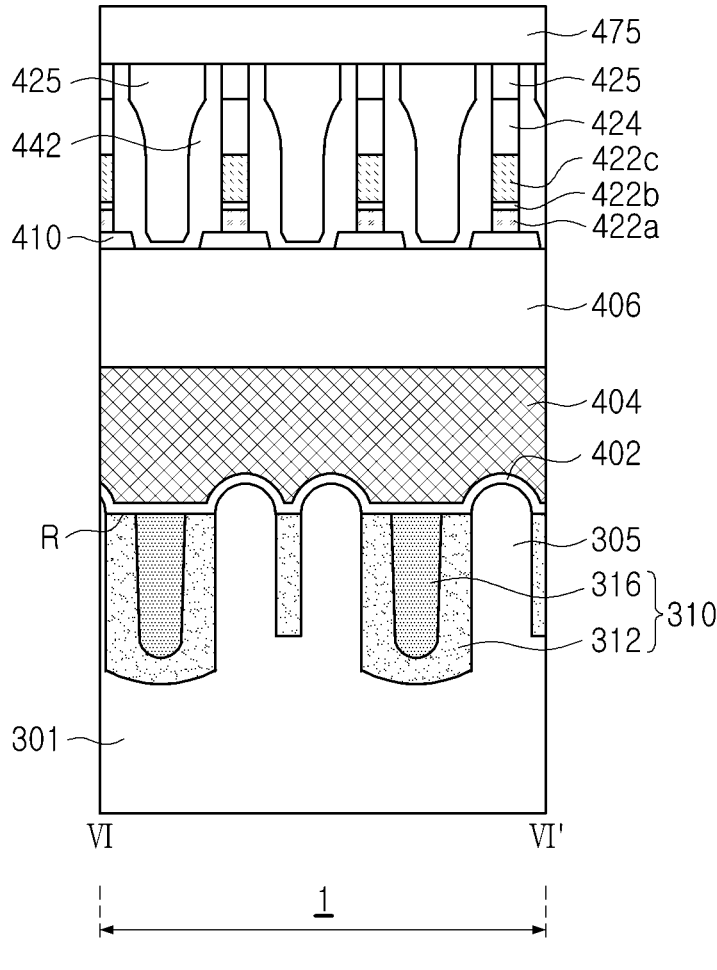
Figure 26C:
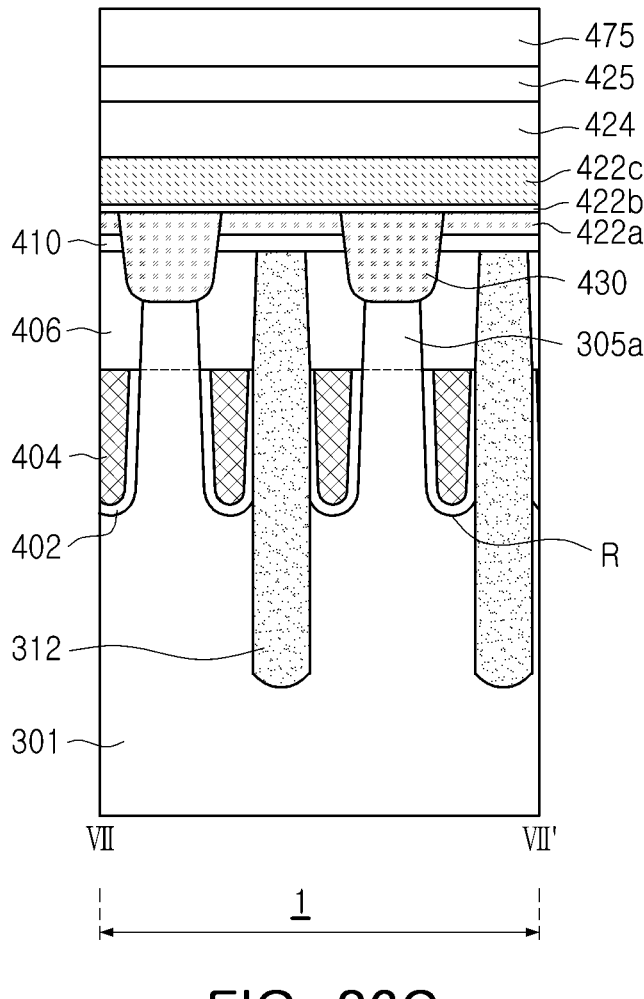
Figure 27A:
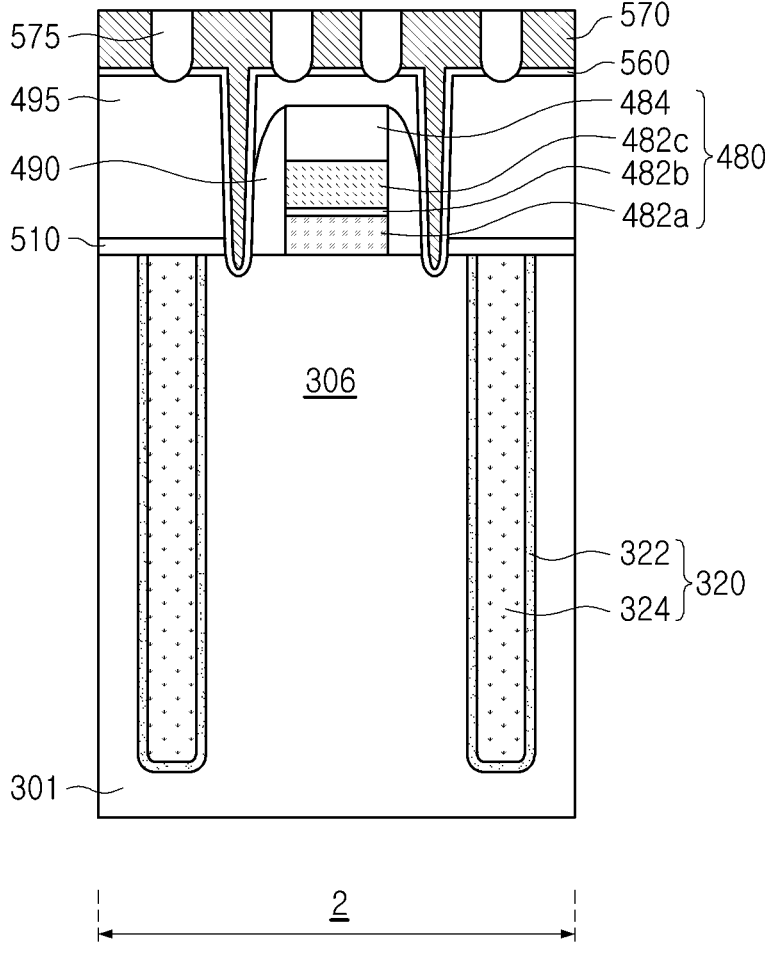
FIG. 27A is a cross-sectional diagram illustrating a semiconductor device in a region corresponding to a second region 2 in FIG. 14.
Figure 27B:
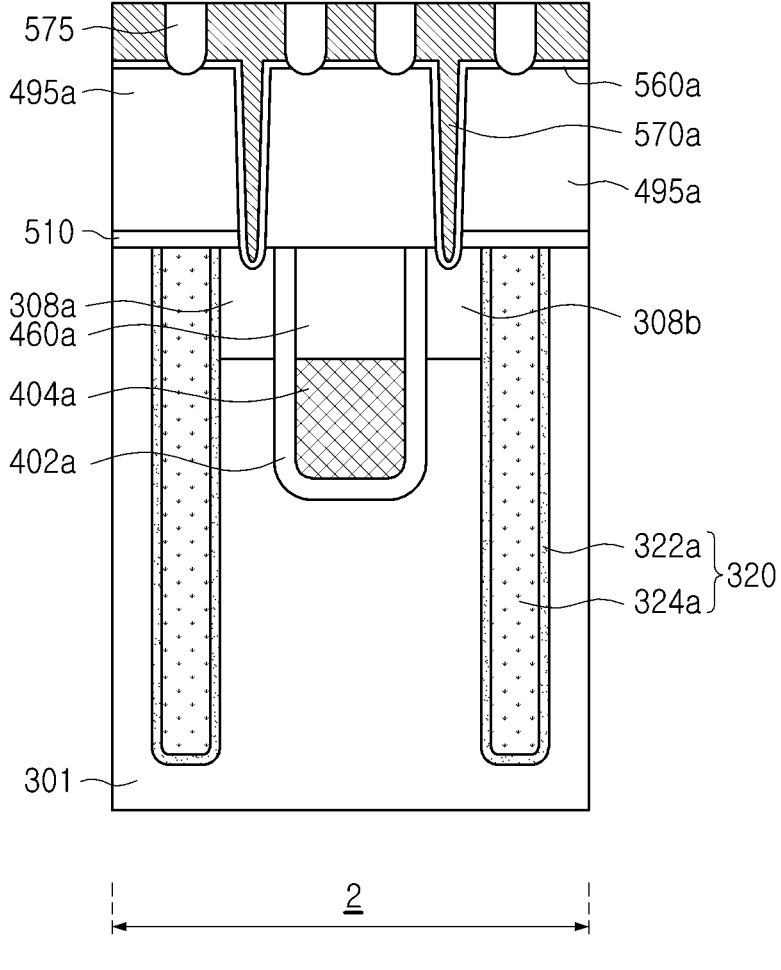
FIG. 27B is a cross-sectional diagram illustrating a semiconductor device in a region corresponding to a second region 2 in FIG. 14.

FIG. 25 is a plan diagram illustrating a semiconductor device according to an example embodiment. FIGS. 26A, 26B, and 26C are cross-sectional diagrams illustrating a semiconductor device taken along lines V-V', VI-VI', and VII-VII' in FIG. 25 according to an example embodiment. FIG. 27A is a cross-sectional diagram illustrating a semiconductor device in a region corresponding to a second region 2 in FIG. 14. FIG. 27B is a cross-sectional diagram illustrating a semiconductor device in a region corresponding to a second region 2 in FIG. 14.

Referring to FIGS. 25 to 26C, in the first region 1 of the substrate 301 of the semiconductor device 300, the cell active region 305 may be defined by the cell device isolation layer 310. The cell active regions 305 may be alternately disposed in the first direction and may be disposed linearly in the second direction. The cell device isolation layer 310 may include a first isolation insulating layer 312 formed of silicon oxide and a second isolation insulating layer 316 formed of silicon nitride.

The word lines WL may extend across the cell active region 305 in the X direction and may be disposed parallel to each other in the Y direction. Bit lines BL extend in the Y direction on the word lines WL and may be disposed parallel to each other in the X direction. The bit lines BL may be connected to the cell active region 305 through direct contacts DC.

Storage node contacts BC may be formed between two bit lines adjacent to each other among the bit lines BL. The storage node contacts BC may be connected to the cell active region 305 through direct contacts DC. The storage node contacts BC may be disposed linearly in the X and Y directions.

A recess region R for forming the transistor TR may be formed on the substrate 301 of the semiconductor device 300. The recess region R may be formed to extend in a line pattern having a constant width. The recess region R may be formed to cross the cell active region 305 and the cell device isolation layer 310 and to be parallel in the X direction. The recess region R may be formed on both edges of the cell active region 305.

The transistor TR may be formed in the cell active region 305. The transistor TR may include a gate insulating layer 402, a gate electrode 404, a gate capping layer 406, a first impurities region 305a, and a second impurities region 305b. The gate insulating layer 402 may be formed on the internal surface of the recess region R. The gate insulating layer 402 may be formed between the cell active region 305 and the gate electrode 404.

A gate electrode 404 may be disposed on the gate insulating layer 402. The cell device isolation layer 310 and the cell active region 305 may face the gate electrode 404 with the plurality of gate insulating layers 402 interposed therebetween. An upper surface of the first isolation insulating layer 312 may be in contact with a lower surface of the gate insulating layer 402. An upper surface of the second isolation insulating layer 316 may be in contact with a lower surface of the gate insulating layer 402.

For example, the gate insulating layer 402 may be formed of at least one material selected from among an insulating material such as silicon oxide or silicon oxynitride, and a metal oxide such as hafnium oxide, aluminum oxide, or zirconium oxide. The gate insulating layer 402 may be formed by an atomic layer deposition (ALD) process.

The gate electrode 404 may be buried in a lower portion of the recess region R. The upper surface of the gate electrode 404 may be disposed on a level lower than a level the upper surface of the cell active region 305. For example, the gate electrode 404 may be formed of one of silicon oxide, silicon oxynitride, or a combination thereof. The gate electrode 404 may form a word line.

In the recess region R, the level of the portion in which the cell active region 305 faces the recess region R may be higher than the level of the portion in which the cell device isolation layer 310 may face the recess region R. A lower surface of the gate electrode 404 may have an uneven shape corresponding to a lower-surface profile of the recess region R, and a saddle fin transistor (saddle FINFET) may be formed in the cell active region 305.

A gate capping layer 406 may be formed to cover the gate electrode 404 on the gate electrode 404. The gate capping layer 406 may fill an upper portion of the recess region R.

An upper surface of the gate capping layer 406 may be disposed on the same level as a level of an upper surface of the cell active region 305. The gate capping layer 406 may include an insulating material. For example, the gate capping layer 406 may include silicon nitride.

The first impurities region 305*a* may be disposed in the cell active region 305 disposed between the pair of gate electrodes 404. The second impurities region 305*b* may be formed in the cell active region 305 disposed on both sides of a pair of gate electrodes 404. The first impurities region 305*a* and the second impurities region 305*b* may be doped with an n-type impurities. The first impurities region 305*a* and the second impurities region 305*b* may work as source and/or drain regions.

A buffer insulating layer 410 may be formed on the cell active region 305 and the cell device isolation layer 310. For example, the buffer insulating layer 410 may be formed of silicon oxide, silicon nitride, or a combination thereof. The buffer insulating layer may be formed as a single layer or a multilayer.

The bit line structure 420 may include bit lines 422*a*, 422*b*, and 422*c* and a hard mask pattern 424. The bit lines 422*a*, 422*b*, and 422*c* may cross the word line WL and may extend in the Y direction and may be disposed parallel to each other in the X direction. The bit lines 422*a*, 422*b*, and 422*c* may be connected to a first impurities region 305*a* of the cell active region 305 through the first contact plug 430.

The bit lines 422*a*, 422*b*, and 422*c* may include a first conductive pattern 422*a*, a second conductive pattern 422*b*, and a third conductive pattern 422*c*. A second conductive pattern 422*b* may be formed on the first conductive pattern 422*a*, and a third conductive pattern 422*c* may be formed on the second conductive pattern 422*b*. The bit lines 422*a*, 422*b*, and 422*c* may be formed in a triple-layer stack structure including the first conductive pattern 422*a*, the second conductive pattern 422*b*, and the third conductive pattern 422*c*, but an example embodiment thereof is not limited thereto. For example, the bit lines 422*a*, 422*b*, and 422*c* may be formed in a single layer stack structure, a double-layer stack structure, or a stack structure of four or more layers.

For example, the first conductive pattern 422*a* may include a semiconductor material such as polysilicon doped with impurities. The second conductive pattern 422*b* may include a metal-semiconductor compound. The metal-semiconductor compound may be configured as, for example, a layer in which a portion of the first conductive pattern 422*a* is silicided. The second conductive pattern 422*b* may include, for example, cobalt silicide (CoSi), titanium silicide (TiSi), nickel silicide (NiSi), tungsten silicide (WSi), or other metal silicide. The third conductive pattern 422*c* may include a metal such as tungsten, titanium, or tantalum, or a conductive metal nitride such as a nitride thereof. The first conductive pattern 422*a*, the second conductive pattern 422*b*, and the third conductive pattern 422*c* are not limited to the above-mentioned material.

The hard mask pattern 424 may be formed on the bit lines 422*a*, 422*b*, and 422*c*. The hard mask pattern 424 may include the above-described insulating material. For example, the hard mask pattern 424 may be silicon nitride.

An insulating pattern 425 may be formed on the bit line structure 420. The insulating pattern 425 may also be formed between the bit line structures 420. The first contact plug 430 may be buried in the first contact hole 430H exposing a portion of the cell active region 305 and may be electrically connected to the cell active region 305. The first contact hole 430H may penetrate a portion of the first impurities region

305*a* of the cell active region 406*a*, and the cell device isolation layer 310 and the gate capping layer 406 adjacent thereto, such that a lower end thereof may be disposed on a level lower than a level of the upper surface of the cell active region 305. The first contact plug 430 may form a direct contact DC connecting the bit lines 422*a*, 422*b*, and 422*c* to the cell active region 305.

A lower end of the first contact plug 430 may be insulated from the gate electrode 404 by the gate capping layer 406. For example, the first contact plug 430 may include an epitaxial silicon layer. The first contact plug 430 may include polysilicon doped with impurities. The insulating spacer 440 may be disposed between the internal surface of the first contact hole 430H and the first contact plug 430. The insulating spacer 440 may include an insulating material buried in the first contact hole 430H and may surround the side surface of the first contact plug 430. The insulating spacer 440 may allow the first contact plug 430 to be insulated from the second contact plug 450 adjacent thereto. For example, the insulating spacer 440 may have a plurality of stack structures stacked in sequence on both sides of the bit line structure 420.

The second contact plug 450 may be formed by being buried in the second contact hole 450H formed between two bit lines 422*a*, 422*b*, and 422*c* adjacent to each other. The second contact plug 450 may extend to upper portions of two bit lines 422*a*, 422*b*, and 422*c* adjacent to each other. In an example embodiment, the second contact plugs 450 may be arranged linearly in the X and Y directions. The second contact plug 450 may form a storage node contact BC. The second contact plug 450 may include a semiconductor material such as polysilicon, a metal such as tungsten, titanium, or tantalum, or a conductive metal nitride such as nitride thereof. A metal-semiconductor compound layer 455 may be disposed between the second contact plug 450 and the landing pad 470. The metal-semiconductor compound layer 455 may include, for example, cobalt silicide (CoSi), titanium silicide (TiSi), nickel silicide (NiSi), tungsten silicide (WSi), or other metal silicide.

The barrier layer 460 may be formed on the insulating spacer 440 and the second contact plug 450. The barrier layer 460 may be optional, according to some embodiments.

In another example embodiment, the landing pad 470 may be formed to cover the second contact plug 450 and the insulating spacer 440. The landing pad 470 and the second contact plug 450 may connect lower electrodes (not illustrated) of capacitors formed on the bit lines 422*a*, 422*b*, and 422*c* to the cell active regions 305. The landing pad 470 may be disposed to partially overlap the second contact plugs 450.

Referring to FIG. 27A, in the second region 2 of the semiconductor device 300, a peripheral active region 306 may be formed by the peripheral device isolation layer 320 formed of silicon oxide. The peripheral device isolation layer 320 may include a first peripheral insulating layer 322 and a second peripheral insulating layer 324. The first peripheral insulating layer 322 may have a thickness smaller than that of the first isolation insulating layer 312 in FIG. 13A. The first peripheral insulating layer 322 may be formed concurrently with the first isolation insulating layer 312 in FIG. 13A.

Both the first peripheral insulating layer 322 and the second peripheral insulating layer 324 may be formed of silicon oxide. That is, the peripheral device isolation layer 320 may be formed of silicon oxide. The peripheral device isolation layer 320 formed of silicon oxide may prevent a hot electron induced punch-through (HEIP) phenomenon in the sub-word line driving region. As confirmed by the present inventors, the peripheral device isolation layer 320 formed of silicon oxide may prevent issues such as increased power consumption, decreased operating speed, and decreased punch-through voltage, and may improve cell refreshing properties.

A gate electrode structure 480 may be formed on the peripheral active region 306. The gate electrode structure 480 may include a first gate conductive pattern 482*a*, a second gate conductive pattern 482*b*, and a third gate conductive pattern 482*c*. The first gate conductive pattern 482*a* may be formed of the same conductive material as that of the first conductive pattern 422*a* of the bit lines 422*a*, 422*b*, and 422*c*, or may be formed of a different conductive material. For example, both the first gate conductive pattern 482*a* and the first conductive pattern 422*a* may be formed of polysilicon. Even when both are formed of polysilicon, resistance of the first conductive pattern 422*a* may be lower than that of the first gate conductive pattern 482*a* by adjusting process conditions.

Each of the second gate conductive pattern 482*b* and the third gate conductive pattern 482*c* may be formed concurrently with the second conductive pattern 422*b* and the third conductive pattern 422*b* of the bit lines 422*a*, 422*b*, and 422*c*. Accordingly, the second gate conductive pattern 482*b* may be formed of the same conductive material as that of the second conductive pattern 422*b*, and the third gate conductive pattern 482*c* may be formed of the same conductive material as that of the third conductive pattern 422*c*.

The gate electrode structure 480 and the bit lines 422*a*, 422*b*, and 422*c* may be formed at different time points. In some embodiments, the first gate conductive pattern 482*a* may be formed at a different time point from that of the first conductive pattern 422*a*. For example, the first conductive pattern 422*a* may be formed preferentially, and then the first gate conductive pattern 482*a* may be formed thereafter.

A gate insulating capping line 484 may be formed on the gate electrode structure 480. The gate insulating capping line 484 may be formed concurrently with the hard mask pattern 424 on the bit line, such that the gate insulating capping line 484 may be formed of the same insulating material as that of the hard mask pattern 424.

A gate insulating spacer 490 may be formed on both sides of the gate electrode structure 480 and the gate insulating capping line 484. The gate insulating spacer 490 may be formed concurrently with the insulating spacer 440 of the first region 1 or may be formed separately. When concurrently formed, the gate insulating spacer 490 may be formed of the same material as that of the insulating spacer 440.

A gate insulating layer 495 surrounding the gate insulating spacer 490 may be formed on a side surface and an upper surface of the gate insulating spacer 490. The gate insulating layer 495 may also be formed on the gate insulating capping line 484. For example, the gate insulating layer 495 may be formed of silicon oxide, silicon nitride, or a combination thereof.

Contact holes may be formed in the gate insulating layer 495, and a barrier layer 560 may be formed on an internal wall of the contact hole. Each of the contact hole and the barrier layer 560 may be formed concurrently with the second contact hole 450H and the barrier layer 460 of the first region 1, and the contact hole and the barrier layer 560 may be formed of the same material.

A conductive line 570 may be formed on the barrier layer 560. The conductive line 570 may be formed of the same material as that of the landing pad 470 disposed in the first region 1 and may be formed concurrently with the landing pad 470. The conductive line 570 may be formed of metal, metal nitride, conductive polysilicon, or a combination thereof. For example, the conductive line 570 may include tungsten.

Although not illustrated, a dummy conductive layer may be present in at least a portion of the second region 2. For example, during the manufacturing process of the semiconductor device 300, patterning may be performed to form the gate electrode structure 480 in the second region 2. Thus, in the peripheral circuit region, and in this patterning process, a portion of the dummy conductive layers may remain without being removed.

Referring to FIG. 27B, a buried gate may be formed in the second region 2 of the semiconductor device 300. The buried gate may be formed to cross the peripheral active region 308. The buried gate may include a gate insulating layer 402*a* formed to be in contact with the peripheral active region 308, a gate electrode 404*a* formed on the gate insulating layer 402*a*, and a gate capping layer 406*a* formed on the gate electrode 404*a*.

Peripheral device isolation layers 320*a* may be formed on both sides of the buried gate. Source/drain patterns 308*a* and 308*b* may be formed on both sides of the buried gate. An interlayer insulating layer 495*a* may be formed on the peripheral active region 308*a*. A contact hole may be formed in the interlayer insulating layer 495*a*, and a conductive line may be formed in the contact hole and may be connected to the source/drain patterns 308*a* and 308*b*.

According to the aforementioned example embodiments, in a method of manufacturing a semiconductor device using multi-patterning technology, a mask may be formed only on a partial region of a substrate, and a second spacer layer may be formed on the first spacer layer by selectively deposition. Thereafter, by etching an etch target layer disposed on the substrate, the widths of the pattern portions or the distance between the pattern portions may be formed differently in the regions.

By forming a second insulating layer on the first insulating layer in the peripheral circuit region to fill the trench by a selective deposition process, hot electron induced punch-through (HEIP) phenomenon in the sub-word line driving region of the peripheral circuit region may be reduced, such that electrical properties may improve, and it may not be necessary to perform the process of removing nitride in the peripheral trench in the peripheral circuit region. Accordingly, a semiconductor device manufactured through a simplified manufacturing process, and a method of manufacturing the same may be provided.

While the example embodiments have been illustrated and described above, it will be configured as apparent to those skilled in the art that modifications and variations could be made without departing from the scope of the present disclosure as defined by the appended claims.

What is claimed is:

1. A method of manufacturing a semiconductor device, comprising:

forming a stack of: (i) a first mask layer, (ii) a second mask layer, and (iii) a third mask layer, on an etch target layer, which extends on an underlying substrate;

etching the third mask layer to define third mask patterns;

forming a first spacer layer on the third mask patterns;

forming a mask that covers the first spacer layer on a first region of the substrate and exposes the first spacer layer on a second region of the substrate;

while the first spacer layer on the first region is at least partially covered by the mask, forming a second spacer layer on a portion of the first spacer layer exposed by the mask, using a selective dielectric-on-dielectric deposition process;

removing the mask to thereby expose the first spacer layer on the first region;

forming first spacer patterns by etching the first spacer layer on the first region, and second spacer patterns by etching the first spacer layer and the second spacer layer on the second region;

forming second mask patterns by etching the second mask layer using the first spacer patterns and the second spacer patterns as an etching mask; then forming first mask patterns by etching the first mask layer using the second mask patterns as an etching mask; and etching the etch target layer using the first mask patterns as an etching mask.

2. The method of claim 1, wherein the second spacer layer is formed to not cover the mask.

3. The method of claim 1, wherein each of the second spacer patterns is in contact with a sidewall of each of the first spacer patterns on the second region.

4. The method of claim 1, wherein the etch target layer is etched to define first pattern portions on the first region and second pattern portions on the second region; and wherein a second width of each of the second pattern portions is greater than a first width of each of the first pattern portions.

5. The method of claim 4, wherein a pitch between first pattern portions is substantially equal to a pitch between the second pattern portions.

6. The method of claim 1, wherein the forming the first and second spacer patterns includes:

forming fourth mask patterns filling a space between the third mask patterns, covering a sidewall of the first spacer layer on the first region, and covering a sidewall of the second spacer layer on the second region; and etching the fourth mask patterns, the first spacer layers, and the second spacer layers until the third mask patterns are exposed.

7. The method of claim 6, wherein each of the first spacer patterns and the second spacer patterns are formed to have a generally U-shape cross-section.

8. The method of claim 6, wherein the forming the second mask patterns includes:

removing vertical portions of the first spacer patterns and vertical portions of the second spacer patterns; and etching the second mask layer using: (i) the fourth mask patterns covering horizontal portions of the first spacer patterns and horizontal portions of the second spacer patterns, and (ii) the third mask patterns covering the second mask layer, as an etching mask.

9. The method of claim 8, wherein the etch target layer is etched and formed as first pattern portions on the first region and second pattern portions on the second region; and wherein a second distance between the second pattern portions is greater than a first distance between the first pattern portions.

10. The method of claim 1, further comprising:

removing the first mask patterns, the second mask patterns, and the third mask patterns.

11. A method of manufacturing a semiconductor device, comprising:

forming a substrate having first and second regions therein with unequal densities of active regions in the first and second regions;

forming a cell trench defining cell active regions in the first region and a peripheral trench defining peripheral active regions in the second region;

forming a first insulating layer in the cell trench and in the peripheral trench;

forming a mask that covers the first insulating layer in the first region, but exposes the first insulating layer in the second region;

forming a second insulating layer on a portion of the first insulating layer in the second region that is exposed by the mask, using a dielectric-on-dielectric selective deposition process;

after forming the second insulating layer, exposing the first insulating layer in the first region by removing the mask; and forming a third insulating layer on the first insulating layer in the first region and on the second insulating layer in the second region.

12. The method of claim 11, wherein the second insulating layer is formed to not cover the mask.

13. The method of claim 11, wherein the cell trench has a first cell trench portion having a first width between the cell active regions spaced apart from each other in a first direction and a second cell trench portion having a second width greater than the first width between the cell active regions spaced apart from each other in a second direction; and wherein the peripheral trench includes a first peripheral trench portion having a third width and a second peripheral trench portion having a fourth width greater than the third width.

14. The method of claim 13, wherein the first insulating layer is formed to fill a portion of the first cell trench; and wherein the first insulating layer is formed to conformally cover an internal wall of each of the second cell trench portion, the first peripheral trench portion, and the second peripheral trench portion.

15. The method of claim 14, wherein the second insulating layer is formed to be in contact with the first insulating layer in the first peripheral trench portion and to fill at least a portion of the first peripheral trench portion; and wherein the second insulating layer is formed to conformally cover a sidewall of the first insulating layer in the second peripheral trench portion.

16. The method of claim 15, wherein the third insulating layer is formed to be in contact with the first insulating layer in the second cell trench portion and to fill the second cell trench portion; and wherein the third insulating layer extends from the first region to the second region and is formed to conformally cover sidewalls of the second insulating layer in the second peripheral trench portion.

17. The method of claim 16, further comprising:

forming a fourth insulating layer in contact with the third insulating layer in the second peripheral trench portion and filling the second peripheral trench portion.

18. The method of claim 17, further comprising performing a planarization process until an upper surface of the substrate is exposed after the forming the fourth insulating layer.

19. A method of manufacturing a semiconductor device, the method comprising:

forming a substrate having first and second regions therein, which contain unequal densities of active regions in the first and second regions;

forming a cell trench that defines cell active regions in the first region, a first cell trench portion having a relatively narrow width in the first region, and a second cell trench portion having a relatively wide width in the first region;

forming a peripheral trench that defines peripheral active regions in the second region, a first peripheral trench portion having a relatively narrow width in the second region, and a second peripheral trench portion having a relatively wide width in the second region;

forming a first insulating layer in contact with a sidewall of the cell active regions in the cell trench, and in contact with a sidewall of the peripheral active regions in the peripheral trench;

forming a mask on the first insulating layer in the first region;

forming a second insulating layer on the first insulating layer in the second region, using a selective dielectric-on-dielectric deposition process;

after forming the second insulating layer, exposing the first insulating layer in the first region by removing the mask;

forming a third insulating layer on the first insulating layer in the first region and on the second insulating layer in the second region;

forming a fourth insulating layer on the third insulating layer; then performing a planarization process until an upper surface of the substrate is exposed;

forming a gate trench crossing the cell active regions in the substrate in the first region;

forming a gate in the gate trench; and forming a peripheral gate on the peripheral active regions in the second region.

20. The method of claim 19, wherein the first insulating layer is formed to fill the first cell trench portion and to conformally cover an internal wall of each of the second cell trench portion, the first peripheral trench portion, and the second peripheral trench portion;

wherein the second insulating layer is formed to be in contact with the first insulating layer in the first peripheral trench portion, to fill the first peripheral trench portion, and to conformally cover a sidewall of the first insulating layer in the second peripheral trench portion; and wherein the first insulating layer and the second insulating layer in the first peripheral trench portion remain without being removed while the above described processes are performed.

* * * * *